United States Patent [19]

Hirzel et al.

[11] Patent Number: 4,608,702

[45] Date of Patent: Aug. 26, 1986

[54] METHOD FOR DIGITAL CLOCK RECOVERY FROM MANCHESTER-ENCODED SIGNALS

[75] Inventors: Frederic J. Hirzel, Cupertino, Calif.; Roy J. Levy, Ashland, Oreg.

[73] Assignee: Advanced Micro Devices, Inc., Sunnyvale, Calif.

[21] Appl. No.: 684,919

[22] Filed: Dec. 21, 1984

[51] Int. Cl.⁴ ............................................. H04L 7/02
[52] U.S. Cl. ...................................... 375/110; 375/87; 375/118; 328/63
[58] Field of Search ................... 375/110, 118, 87, 95, 375/113; 328/55, 63, 72; 377/33

[56] References Cited

U.S. PATENT DOCUMENTS 3,778,550 12/1973 David et al. ............................ 328/72
4,385,396 5/1983 Norton ................................... 375/110

Primary Examiner—Jin F. Ng
Assistant Examiner—M. Huseman
Attorney, Agent, or Firm—Patrick T. King; Kenneth B. Salomon

[57] ABSTRACT

A method for rapidly recovering the clock from Manchester-encoded signals using simple digital techniques is provided for use in an inexpensive Manchester-encoding receiver. The received Manchester-encoded signal is monitored to determine zero-voltage crossing. At each such crossing the frequency of the recovered clock is adjusted by comparing the occurrence of the zero-crossing with respect to the midpoint of the period of the presently-generated recovered clock. Shorten, center or lengthen adjustment signals are generated as a result of this comparison which are used to shorten or lengthen, by 1/16 increments of the inter-bit period of the received data signal, the period of the next-generated recovered-clock. The method is readily implemented as a sixteen-stage programmable counter providing a phase-locked loop.

3 Claims, 10 Drawing Figures

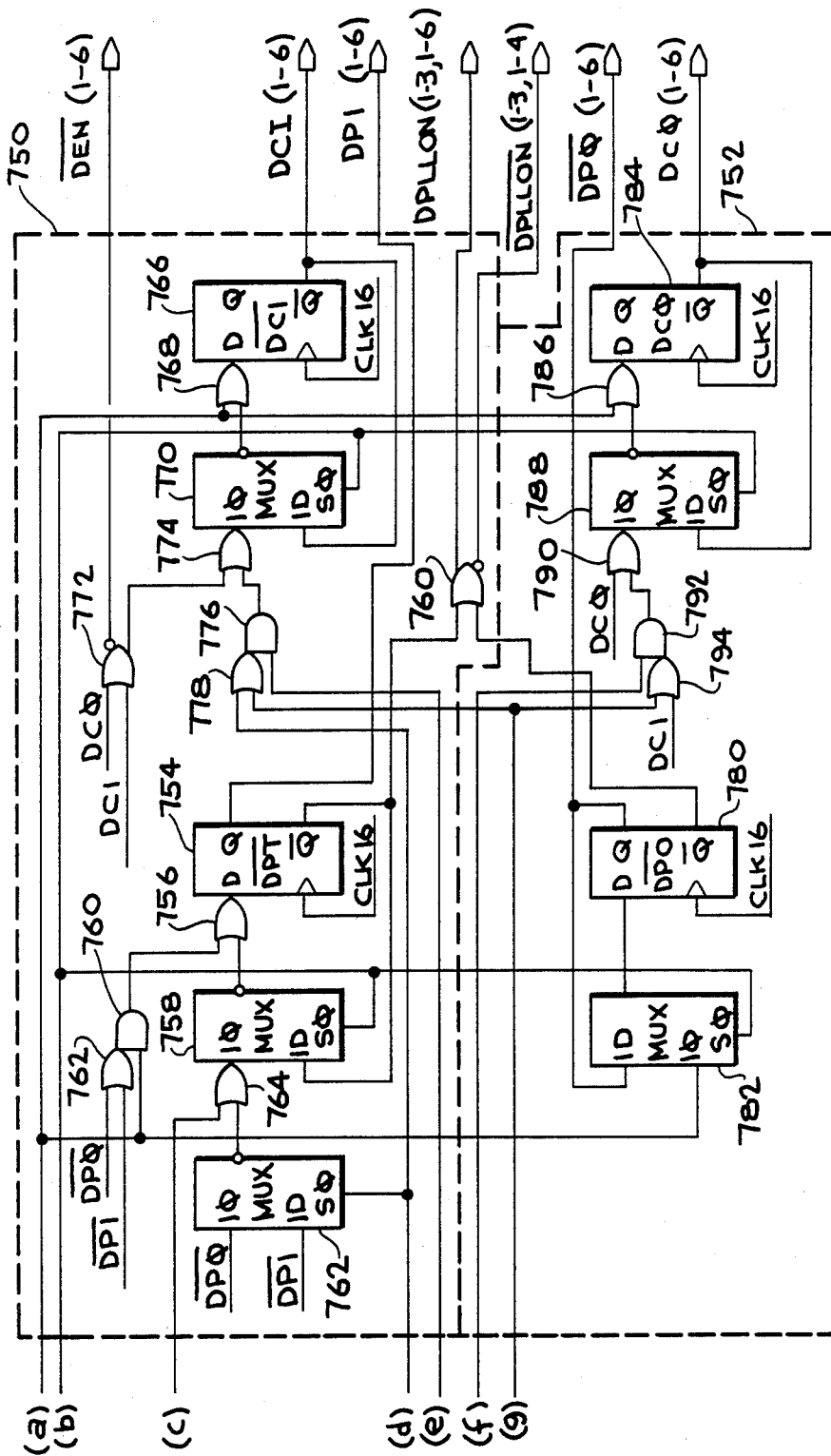

METHOD FOR DIGITAL CLOCK RECOVERY FROM MANCHESTER-ENCODED SIGNALS

CROSS-REFERENCE TO RELATED APPLICATION

Related copending application of particular interest to this invention is application Ser. No. 684,085, filed Dec. 21, 1984, on behalf of Roy Levy and Frederic J. Hirzel entitled "A Method for Detection of Line Activity for Manchester-encoded Signals", assigned to the assignee of the instant application.

FIELD OF THE INVENTION

This invention relates to decoding receivers for Manchester-encoded signals and, in particular, to a method for recovering a decoding clock from Manchester-encoded signal received on a data communication signalling line.

BACKGROUND OF THE INVENTION

The proliferation of localized data-processing and data-handling equipment has spurred provision of data signal communication via inexpensive communication links between these various equipments linked together to form local area network systems. Serial transmission of data on only one inexpensive signal line such as a twisted pair of wires or a coaxial cable is a cost-effective way of linking data equipment into a local area network.

Data signals sent on signal lines are subject to distortion and electrical interference, in the form of impulse noise and the like. Recovery of data information from a distorted and noisy transmitted data signal by a receiver requires the use of a local clock signal at the receiver. Providing a separate clock signal at the receiver site which is synchronous with the transmitted data is a significant problem. Transmitting a separate clock signal on a separate line is an expensive solution. Conventional non-return-to-zero (NRZ) data signals usually contain a direct-current dc component, which is particularly strong on long strings of ONEs or ZEROs. For NRZ data signals, the dc component must be propagated through the signal line. It should be appreciated that transmission of a data signal through an alternating-current ac coupled signal line is desirable and that providing for direct-current (dc) coupling of a data signal is an expensive undertaking.

Manchester-encoding of a data signal prior to transmission overcomes the above mentioned problems of transmitting a separate clock signal and of providing dc coupling for the data signal.

A Manchester-encoded data signal solves these problems by being a so-called self-clocking signal and by having no dc component. In simplest form, a Manchester-encoded signal can be thought of as being generated by combining the data signal with the clock signal. The combination is then transmitted through an ac-coupled transmission medium.

To generate a Manchester encoded signal an NRZ data signal and a square wave clock signal are combined in an EXCLUSIVE-OR gate to produce a Manchester-encoded signal having a 50-50 duty cycle. For one half of a bit period, the Manchester-encoded signal is at a ONE binary level, and for the other half of the bit period, the Manchester-encoded signal is at its complementary binary level. Consequently, no dc component is produced and Manchester-encoded signals, having no dc component, are well suited for transmission through ac-coupled systems.

From the above, it should be recognized, that for each bit period of a Manchester-encoded signal, a transition from a binary ZERO to a binary ONE, or vice-versa, must occur. This doubles the transmission bandwidth required for a Manchester-encoded transmission system but provides significant advantages, as described above. For a square-wave clock, the transition occurs at the middle of the bit cell, or bit period. Depending upon the phase of the clock signal in a bit period, the transition from a ZERO to a ONE level represents either a ONE data bit or ZERO data bit. Similarly, the transition from a one to a zero level represents the opposite type of data bit. Because the Manchester-encoded data signal always has a transition occuring at the middle of a bit period, a clock signal can, in principle, be recovered at a receiver. However, distortion and noise on a received Manchester-encoded signal make detection of data transitions and subsequent reconstruction of a received clock signal difficult because a receiver cannot distinguish between a valid Manchester-encoded signal and noise. This situation is particularly troublesome when a signal line has been in an idle state with no signals on the line and when a valid Manchester-encoded signal is subsequently sent. A receiver which cannot adequately distinguish noise signals from the start of the sequence of valid Manchester-encoded signals is unable to begin to properly recover the clock signal and ultimately to provide a synchronized clock signal for subsequent recovery of Manchester-encoded data signals. Thus, it should be appreciated that recovery and synchronization of clock signal for a Manchester-encoded data receiver are critical functions.

The problems of synchronization of a receiver clock and recognition of valid Manchester-encoded signal activity on a signalling line, have been addressed with a number of system solutions. For example, systems which operate in conformity with MIL-STD 1553 use a so-called synchronizing impulse data string which precedes valid data. The synchronizing impulse, of course, can be sent on a separate signal line, but obviously, that is an undesirable solution.

In another approach, a conventional analog phase-locked loop is used in a receiver to lock on the input signal and recover a receive-clock reference signal. However, fast clock acquisition requires wide loop bandwidths while operation with noisy signal requires narrow loop bandwidths, and the resulting receiver suffers a compromised performance.

SUMMARY OF THE INVENTION

Accordingly, an object of the invention is to provide a method for synchronizing the receiver clock from Manchester-encoded signals without the limitations imposed by analog techniques, and can be implemented in an inexpensive Manchester-encoded receiver.

In accordance with the invention, a method for rapidly recovering the clock from Manchester-encoded signals using only simple digital techniques is provided. This includes detection of zero-crossings of the received Manchester-encoded signal and adjusting the frequency of the recovered clock by comparing the occurrence of the zero-crossing of the received signal with the occurrence of the midpoint of the period of the presently-generated recovered clock. Shorten, center and lengthen adjustment signals are provided as a result of the comparison which are used to shorten or lengthen by a 1/16 increment of the received bit period, the period of the next-generated recovered clock.

A technique readily-implemented on a sixteen-state programmable counter, uses the adjustment signals and the state of the programmable counter in simple Boolean equations to determine the next state of the programmable counter. In this way, a one-state self-loop or a two-state jump is performed to affect a 1/16-bit period lengthening, or shortening, respectively, of the period of the counter.

BRIEF DESCRIPTION OF THE DRAWINGS

The accompanying drawings which are imcorporated into and form a part of the specifications, illustrate the invention and, together with their description, serve to explain the principles of the invention.

In the drawings:

FIGS. 7A and 7B are logic diagrams of the Receive Decode Logic section of the Receiver of the present invention.

DETAILED DESCRIPTION OF THE PREFERRED EMBODIMENT

Reference is now made in detail to the present preferred embodiment of the invention which illustrates the best mode presently contemplated by the inventor for practicing the method and apparatus of the invention, the preferred embodiment of which is illustrated in the accompanying drawings.

The invention described herein is the Receiver portion of a single integrated circuit identified as the Advanced Micro Devices Am7960 Coded Data Transceiver. FIG. 1 is a functional block diagram of the Receiver portion of the integrated circuit.

A functional block diagram of a Manchester-encoded Receiver 100 constructed according to the teachings of the instant invention is illustrated in FIG. 1.

A. Manchester-encoded Receiver

Reference should be had to the related copending application Ser. No. 684,085, filed Dec. 21, 1984, on behalf of Roy Levy and Frederic J. Hirzel entitled "A Method for Detection of Line Activity for Manchester-encoded Signals", assigned to the assignee of the instant application, which is hereby incorporated by reference, for a detailed description of the following elements illustrated in FIGS. 1A and 1B the Receive Line Activity Counter 110, the Receive Clock Qualification 120, the Receive Data Interpreter and Supervisor 130 and the Receive Decode Logic 140.

Figure 2:
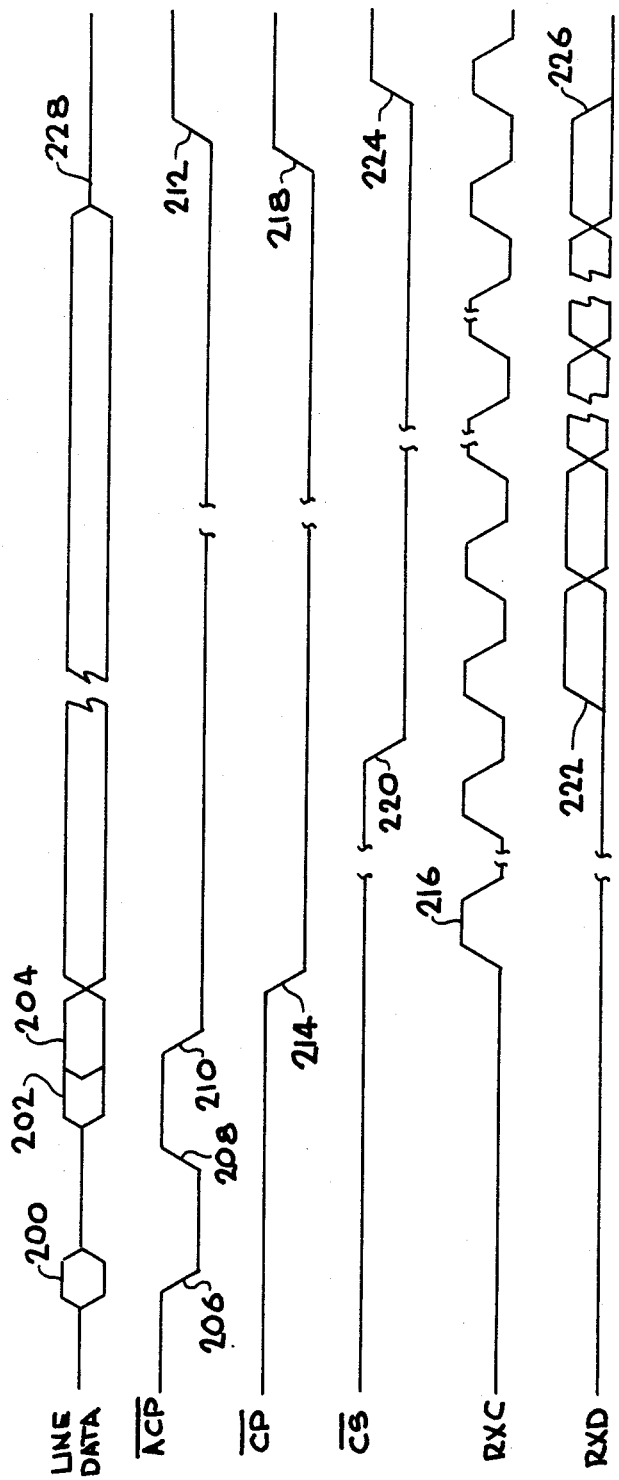
FIG. 2 is a timing diagram of the terminal characteristics of the Manchester-encoded Receiver according to the present invention.

Briefly, the Manchester-encoded signals are received at receiver line terminals $R \times L0$, $R \times L1$ at a receive interface (not illustrated) portion of receiver 100. The ST+ and ST−, and the line input data signals generated by a receiver channel interface are applied to a Receive Clock Qualification block 120 and a Receive Data Interpreter and Supervisor block 130, respectively of Receiver 100. As shown in FIG. 2, status signals are generated at an advance carrier presence (ACP), a carrier presence (CP) and a carrier sense (CS), terminal of Receiver 100 and signals are generated at a receive clock ($R \times C$) and a receive data ($R \times D$) terminals thereof in response to the ST+, ST− and line data signals applied thereto. Internal counterparts, preceded by the letter "I", for these signals are used synonomously hereinafter, for instance IACP is used to represent the internal advance carrier presence signal.

As shown on FIG. 2, after the Receiver 100 has detected line activity 200 at the $R \times L0$, $R \times L1$ terminals of the Receiver, it attempts to acquire information from the line data to generate the signals at the $R \times C$ terminal. This so-called "Clock Qualification" takes place within block 120 and is achieved by sampling the presence levels ST+ and ST−. There must be a differential line voltage signal applied to the $R \times L0$ and $R \times L1$ terminals either above the positive presence level and then below the negative presence level, or below the negative presence level and then above the positive presence level, in $\frac{3}{4}$ to $1\frac{1}{4}$ the inter-bit time of the input LINE DATA. After this occurs, the next detected line activity 202, causes Receiver 100 to initiate acquisition of the receive clock recovery circuitry 150, 204, as shown in FIG. 2.

In response to detection of the transitions of the LINE DATA signals, "line activity" 200, the Receiver 100 causes the signal at the $\overline{ACP}$ terminal to become active, 206 and 210, as shown on the second waveform of FIG. 2. The signal at the $\overline{ACP}$ terminal is inactivated after there has been no line activity detected for 2 inter-bit times, 208, or end of message is detected, 212.

The Receiver 100 causes the signal at the $\overline{CP}$ terminal to become active after the receive clock recovery circuitry 150 has acquired internal clocking 214 and immediately before the signal at the receive clock ($R \times C$) terminal is initiated, 216. The signal at the $\overline{CP}$ terminal is inactivated as is the case with the signal at the $\overline{ACP}$ terminal as described above, 218.

As shown on the fourth waveform of FIG. 2, the Receiver 100 causes the signal at the $\overline{CS}$ terminal to become active 220 when received and decoded data is to be generated at the $R \times D$ terminal of the Receiver 100, 222. The signal at the $\overline{CS}$ terminal remains active until either there has been no line activity detected for 2 inter-bit times 224, or the line data is detected to be other than valid Manchester-encoded. The signals at the $R \times D$ terminal will continue to be generated until $\overline{CP}$ becomes inactive, 226.

The Receiver 100 decodes the input data by sampling within block 130 at $\frac{1}{4}$- and $\frac{3}{4}$- bit intervals following the start of the inter-bit time. If these samples are of opposite binary polarity, valid Manchester-encoded data has been decoded. If these samples are of the same binary polarity as is the sample at the next $\frac{1}{4}$-bit interval, the Receiver 100 determines that an end-of-message has been detected, 228.

B. Logic Circuits of the Receiver

The six functional blocks of Receiver 100, blocks 110, 120, 150, 130, 140 and 160 consist of the components illustrated in the logic diagrams of FIGS. 3, 4, 5, 6, 7 and 8, respectively. A brief description of the circuits shown on these logic diagrams will now be given.

Figure 3:
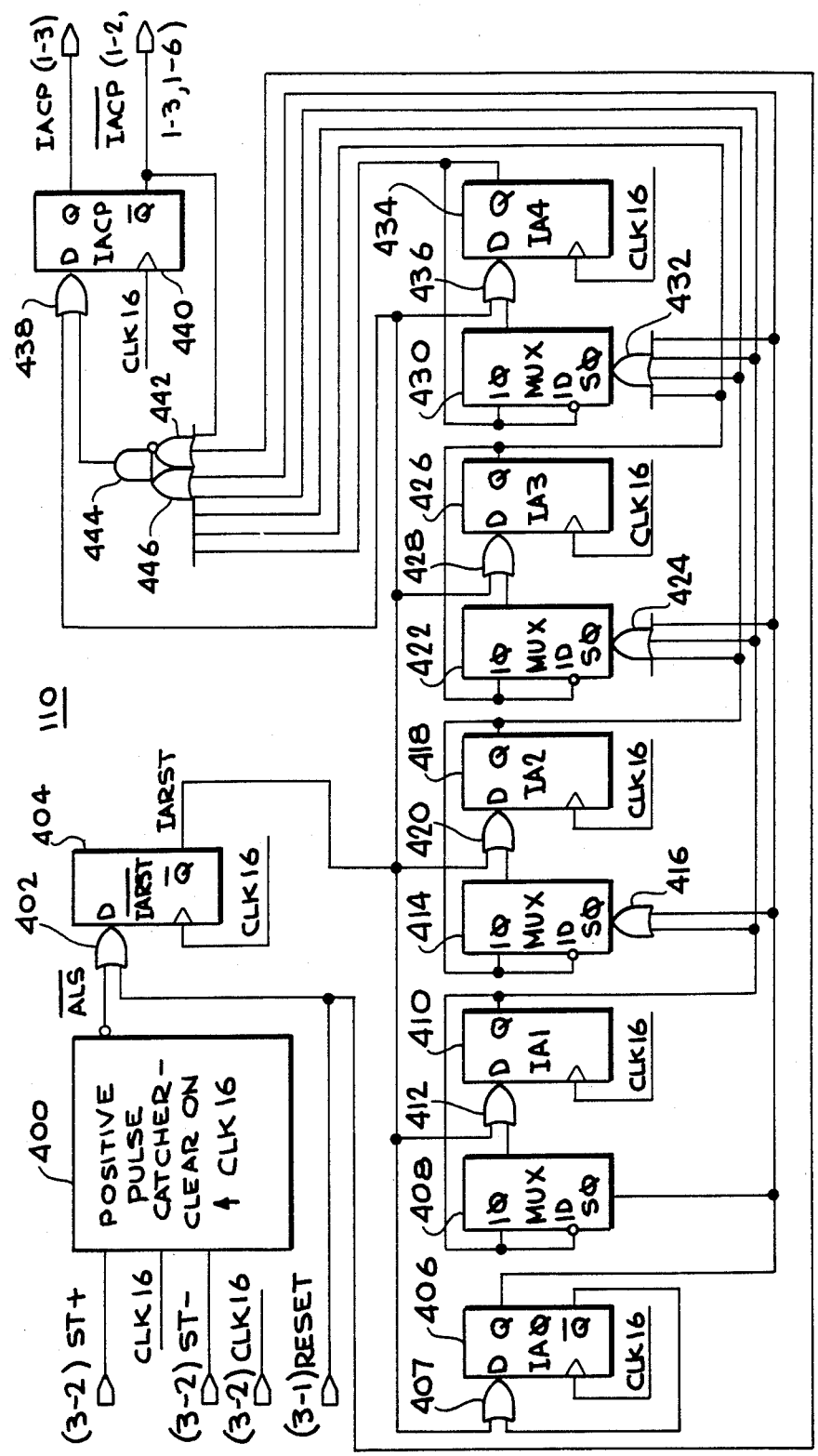
FIG. 3 is a logic diagram of the Receive Line Activity Counter section of the Receiver of the present invention.

With reference to FIG. 3, the Receive Line Activity Counter block 110 includes a positive pulse catcher 400 (112 on FIG. 1A) which receives the ST+ and ST− signals generated by receiver channel interface 10 and a clock signal (CLK16) from a clock internal to block 110 (not shown) with a cycle sixteen times faster than that of the clock signal recovered from the LINE DATA signals.

An advanced line signal (ALS) is generated by pulse catcher 400 when either ST+ or ST− signal has been conducted to the pulse catcher and on the rising edge of the CLK16 signal, the complemented ALS signal is conducted to a first input of an OR gate 402. A second input of OR gate 402 receives a RESET signal conducted from a terminal of Receiver 100. A D-type flip-flop 404 (114 on FIG. 1A) receives at its data input (D) the output signal generated by OR gate 402. Flip-flop 404 also receives the CLK16 signal at its clock input. Flip-flop 404 generates at its complemented output terminal ($\overline{Q}$) an input line activity reset (IARST) signal.

As shown on FIG. 3, the IARST signal is conducted to a 2-bit line active time-out counter portion of block 110 (116 on FIG. 1A), which includes five D-type flip-flops and four multiplexers. A D-type flip-flop 406 receives at its data input (D) the signal generated by an OR gate 407 which, in turn, receives at a first input the IARST signal generated by flip-flop 404. A second input of OR gate 407 receives the signal generated at the complemented output terminal ($\overline{Q}$) of flip-flop 406. Flip-flop 406 also receives the CLK16 signal at its clock input.

A two-in, one-out multiplexer (MUX) 408 receives at a control input (S0) the signal generated at the output terminal (Q) of flip-flop 406, which signal is used by the MUX 408 to select which of the signals applied to MUX 408 at a 1Q or a complemented 1D terminal will be generated at an output of MUX 408.

A second D-type flip-flop 410 receives at its data input (D) the signal generated by an OR gate 412 which, in turn, receives at a first input the IARST signal generated by flip-flop 404. A second input of OR gate 412 receives the signal generated at the output terminal of MUX 408. Flip-flop 410 also receives the CLK16 signal at its clock input. A second two-in, one-out multiplexer (MUX) 414 receives at a control input (S0) the signal generated by an OR gate 416 which, in turn, receives at a first input the signal generated at the output terminal (Q) of flip-flop 410, which signal is also conducted to true (1Q) and complemented (1D) inputs of MUX 408. A second input of OR gate 416 receives the signal generated at the complemented output terminal ($\overline{Q}$) of flip-flop 406. The control signal is used by the MUX 414 to select which of the signals applied to MUX 414 at a 1Q or a complemented 1D terminal will be generated at an output of MUX 414.

A third D-type flip-flop 418 receives at its data input (D) the signal generated by an OR gate 420 which, in turn, receives at a first input the IARST signal generated by flip-flop 404. A second input of OR gate 420 receives the signal generated at the output terminal of MUX 414. Flip-flop 418 also receives the CLK16 signal at its clock input. A third two-in, one-out multiplexer (MUX) 422 receives at a control input (S0) the signal generated by an OR gate 424 which, in turn, receives at a first input the signal generated at the output terminal (Q) of flip-flop 410. A second input of OR gate 424 receives the signal generated at the complemented output terminal ($\overline{Q}$) of flip-flop 406, and a third input of OR gate 424 receives the signal generated at the output terminal (Q) of flip-flop 418, which signal is also conducted to true (1Q) and complemented (1D) inputs of MUX 414. The control signal is used by the MUX 422 to select which of the signals applied to MUX 422 at a 1Q or a complemented 1D terminal will be generated at an output of MUX 414.

A fourth D-type flip-flop 426 receives at its data input (D) the signal generated by an OR gate 428 which, in turn, receives at a first input the IARST signal generated by flip-flop 404. A second input of OR gate 420 receives the signal generated at the output terminal of MUX 422. Flip-flop 418 also receives the CLK16 signal at its clock input. A fourth two-in, one-out multiplexer (MUX) 430 receives a control input (S0) the signal generated by an OR gate 432 which, in turn, receives at a first input the signal generated at the output terminal (Q) of flip-flop 410. A second input of OR gate 432 receives the signal generated at the complemented output terminal ($\overline{Q}$) of flip-flop 406, a third input of OR gate 432 receives the signal generated at the output terminal (Q) of flip-flop 418, and a fourth input of OR gate 432 receives the signal generated at the output terminal (Q) of flip-flop 426, which signal is also conducted to true (1Q) and complemented (1D) inputs of MUX 422. The control signal is used by the MUX 430 to select which of the signals applied to MUX 430 at a 1Q or a complemented 1D terminal will be generated at an output of MUX 430.

A fifth D-type flip-flop 434 receives at its data input (D) the signal generated by an OR gate 436 which, in turn, receives at a first input the IARST signal generated by flip-flop 404. A second input of OR gate 434 receives the signal generated at the output terminal of MUX 430. Flip-flop 434 also receives the CLK16 signal at its clock input. The signal generated at the output terminal (Q) of flip-flop 434 is conducted to true (1Q) and complemented (1D) inputs of MUX 430 as well as to a first input of an OR gate 438.

The signal generated at the output terminal of OR gate 438 is conducted to a data input (D) of a D-type flip-flop 440 (118 on FIG. 1A), which generates at its true output terminal (Q) an internal advance carrier presence (IACP) signal which indicates line activity, and generates at its complement output terminal ($\overline{Q}$) the complement of the IACP signal, $\overline{IACP}$. The $\overline{IACP}$ signal so generated is conducted to a first input to a NOR gate 442, which receives at a second input the signal generated at the complemented output terminal of flip-flop 406. The signal generated by NOR gate 442 is received at a first input of an AND gate 444, which, in turn, has its output terminal connected to a second input terminal of the OR gate 438. An OR gate 446 receives the signals generated at the complement output terminal of flip-flop 406 and the true output terminal of flip-flops 410, 418, 426 and 434. The signal generated by OR gate 446 is received at a second input terminal of AND gate 444. Flip-flop 440 also receives the CLK16 signal at its clock input.

Figure 4:
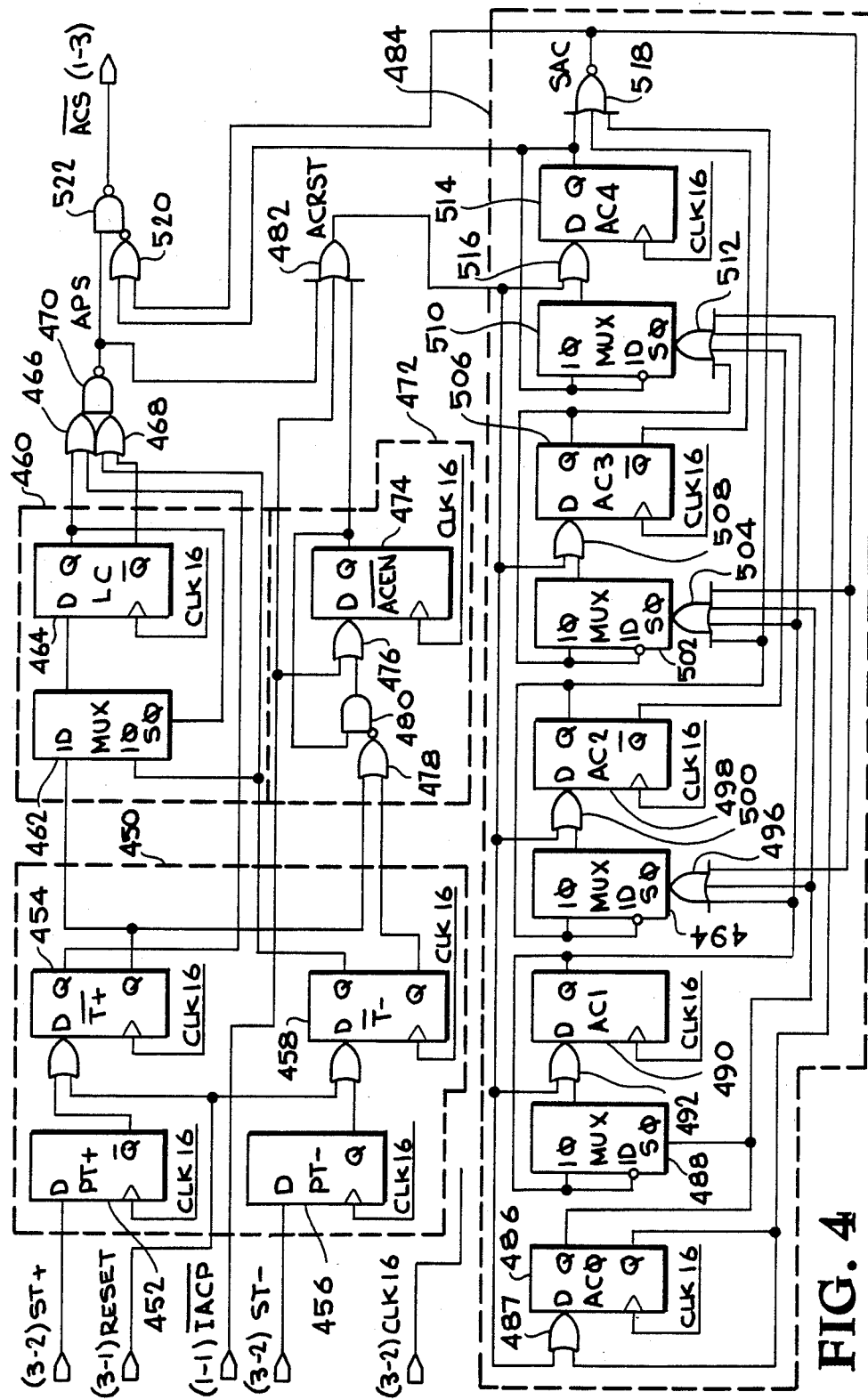
FIG. 4 is a logic diagram of the Receive Clock Qualification section of the Receiver of the present invention.

With reference to FIG. 4, The Receive Clock Qualification block 120 includes an input carrier synchronizer section 450 (122 on FIG. 1A) which receives the ST+ and ST− signals generated by receiver channel interface 10 and a clock signal (CLK16) from a clock internal to block 110 (not shown) with a cycle sixteen times faster than that of the clock signal recovered from the LINE DATA signals. The input carrier synchronizer section 450 includes four D-type flip-flops 452, 454, 456 and 458 which each receive the CLK16 clock signal at their clock inputs. The ST+ signal is applied to the data input (D) terminal of flip-flop 452, which is connected in series with flip-flop 454 to provide double-buffering of the ST+ signal. The ST− signal is applied to the data input (D) terminal of flip-flop 456, which is connected in series with flip-flop 458 to provide double-buffering of the ST− signal. The individually synchronized signals ST+, $\overline{ST+}$, ST−, $\overline{ST−}$ are conducted to a 2-bit clocked shift register (S-R) 460 (124 on FIG. 1A) which includes a two-in, one-out multiplexer (MUX) 462 which receives at a control input (S0) the signal generated at the true output terminal of a D-type flip-flop 464 included in S-R 460. The control signal is used by the MUX 462 to select which of the signals applied to MUX 462 at a 1Q (the signal generated at the true output terminal of flip-flop 458) or a 1D terminal (the signal generated at the complemented output terminal of flip-flop 454) will be generated at an output of MUX 464. Flip-flop 464 receives at its data input terminal (D) the signal generated at output terminal of MUX 462, and the CLK16 signal at its clock input terminal. The 2-clock-cycle-delayed signal generated at the true (Q), and complemented ($\overline{Q}$), output terminals of flip-flop 464 are conducted to logic circuitry consisting of a pair of OR gates 466, and 468, respectively, and the signals generated thereby are received by an AND gate 470. OR gates 466 and 468 also receive the signals generated at the true output terminals of flip-flops 454 and 458, respectively. An activity presence sense (APS) signal is generated at a complemented output of AND gate 470.

A register portion 472 of block 120 (129 on FIG. 1A) includes a D-type flip-flop 474 which receives at its data input (D) a signal generated by an OR gate 476, which in turn receives at a first input terminal the $\overline{IACP}$ signal generated by flip-flop 440 (FIG. 3). An NOR gate 478 receives the output signal generated at the true, and complemented, output terminals of flip-flop 454 and 458, respectively. The signal generated at an output terminal of NOR gate 478 is conducted to a first input terminal of an AND gate 480, which generates a signal conducted to a second input terminal of OR gate 476. A second input terminal of AND gate 480 receives the signal generated at the true output terminal (Q) of flip-flop 474. Flip-flop 474 receives the CLK16 signal at its clock input terminal.

An OR gate 482 (125 on FIG. 1A) receives the APS, $\overline{IACP}$ and the signal generated at the true output terminal of flip-flop 474 and generates therefrom an advanced carrier reset (ACRST) signal which is conducted to a carrier line change pulse width discriminator section 484 (126 on FIG. 1A) of block 120.

As shown on FIG. 4, the ACRST signal is conducted to a 5-bit counter portion of discriminator 484 (126 on FIG. 1A), which includes five D-type flip-flops and four multiplexers. A D-type flip-flop 486 receives at its data input (D) the signal generated by an OR gate 487 which, in turn, receives at a first input the ACRST signal generated by OR gate 482. A second input of OR gate 487 receives the signal generated at the complemented output terminal ($\overline{Q}$) of flip-flop 486. Flip-flop 486 also receives the CLK16 signal at its clock input. A two-in, one-out multiplexer (MUX) 488 receives at a control input (S0) the signal generated at the output terminal (Q) of flip-flop 486, which signal is used by the MUX 488 to select which of the signals applied to MUX 488 at a 1Q or a complemented 1D terminal will be generated at an output of MUX 488.

A second D-type flip-flop 490 receives at its data input (D) the signal generated by an OR gate 492 which, in turn, receives at a first input the ACRST signal generated by OR gate 482. A second input of OR gate 492 receives the signal generated at the output terminal of MUX 488. Flip-flop 490 also receives the CLK16 signal at its clock input. A second two-in, one-out multiplexer (MUX) 494 receives at a control input (S0) the signal generated by an OR gate 496 which, in turn, receives at a first input the signal generated at the output terminal (Q) of flip-flop 490, which signal is also conducted to true (1Q) and complemented (1D) inputs of MUX 488. A second input of OR gate 496 receives the signal generated at the complemented output terminal ($\overline{Q}$) of flip-flop 486. The control signal is used by the MUX 494 to select which of the signals applied to MUX 494 at a 1Q or a complemented 1D terminal will be generated at an output of MUX 494.

A third D-type flip-flop 498 receives at its data input (D) the signal generated by an OR gate 500 which, in turn, receives at a first input the ACRST signal generated by OR gate 482. A second input of OR gate 500 receives the signal generated at the output terminal of MUX 494. Flip-flop 498 also receives the CLK16 signal at its clock input. A third two-input, one-out multiplexer (MUX) 502 receives at a control input (S0) the signal generated by an OR gate 504 which, in turn, receives at a first input the signal generated at the output terminal (Q) of flip-flop 490. A second input of OR gate 504 receives the signal generated at the complemented output terminal ($\overline{Q}$) of flip-flop 486, and a third input of OR gate 504 receives the signal generated at the output terminal (Q) of flip-flop 498, which signal is also conducted to true (1Q) and complemented (1D) inputs of MUX 494. The control signal is used by the MUX 502 to select which of the signals applied to MUX 502 at a 1Q or a complemented 1D terminal will be generated at an output of MUX 502.

A fourth D-type flip-flop 506 receives at its data input (D) the signal generated by an OR gate 508 which, in turn, receives at a first input the ACRST signal generated by OR gate 482. A second input of OR gate 508 receives the signal generated at the output terminal of MUX 502. Flip-flop 506 also receives the CLK16 signal at its clock input. A fourth two-in, one-out multiplexer (MUX) 510 receives at a control input (S0) the signal generated by an OR gate 512 which, in turn, receives at a first input the signal generated at the complemented output terminal ($\overline{Q}$) of flip-flop 498. A second input of OR gate 512 receives the signal generated at the complemented output terminal ($\overline{Q}$) of flip-flop 486, a third input of OR gate 432 receives the signal generated at the complemented output terminal ($\overline{Q}$) of flip-flop 498, and a fourth input of OR gate 512 receives the signal generated at the output terminal (Q) of flip-flop 506, which signal is also conducted to true (1Q) and complemented (1D) inputs of MUX 502. The control signal is used by the MUX 510 to select which of the signals applied to MUX 510 at a 1Q or a complemented 1D terminal will be generated at an output of MUX 510.

A fifth D-type flip-flop 514 receives at its data input (D) the signal generated by an OR gate 516 which, in turn, receives at a first input the ACRST signal generated by OR gate 482. A second input of OR gate 516 receives the signal generated at the output terminal of MUX 510. Flip-flop 514 also receives the CLK16 signal at its clock input. The signal generated at the output terminal (Q) of flip-flop 514 is conducted to true (1Q) and complemented (1D) inputs of MUX 510 as well as to a first input of a NOR gate 518. NOR gate 518 receives at a second input terminal the signal generated at the complemented ($\overline{Q}$) output terminal of flip-flop 506 and at a third input terminal the signal generated at the true (Q) output terminal of flip-flop 498. The signal generated at the output terminal of NOR gate 518 is conducted to a third input terminal of OR gate 496 and to a fourth input terminal of OR gate 504 as well as to a first input terminal of an OR gate 520. The signal generated at the true (Q) output terminal of flip-flop 514 is received at a second input terminal of OR gate 520.

The signal generated at the output terminal of OR gate 520 is conducted to a complemented input terminal of an AND gate 522 (128 On FIG. 1A) and the APS signal generated by NAND gate 470 is received at a true input terminal of AND gate 522, which generates at a complemented output terminal an advanced carrier sense ($\overline{ACS}$) signal therefrom.

Figure 5:
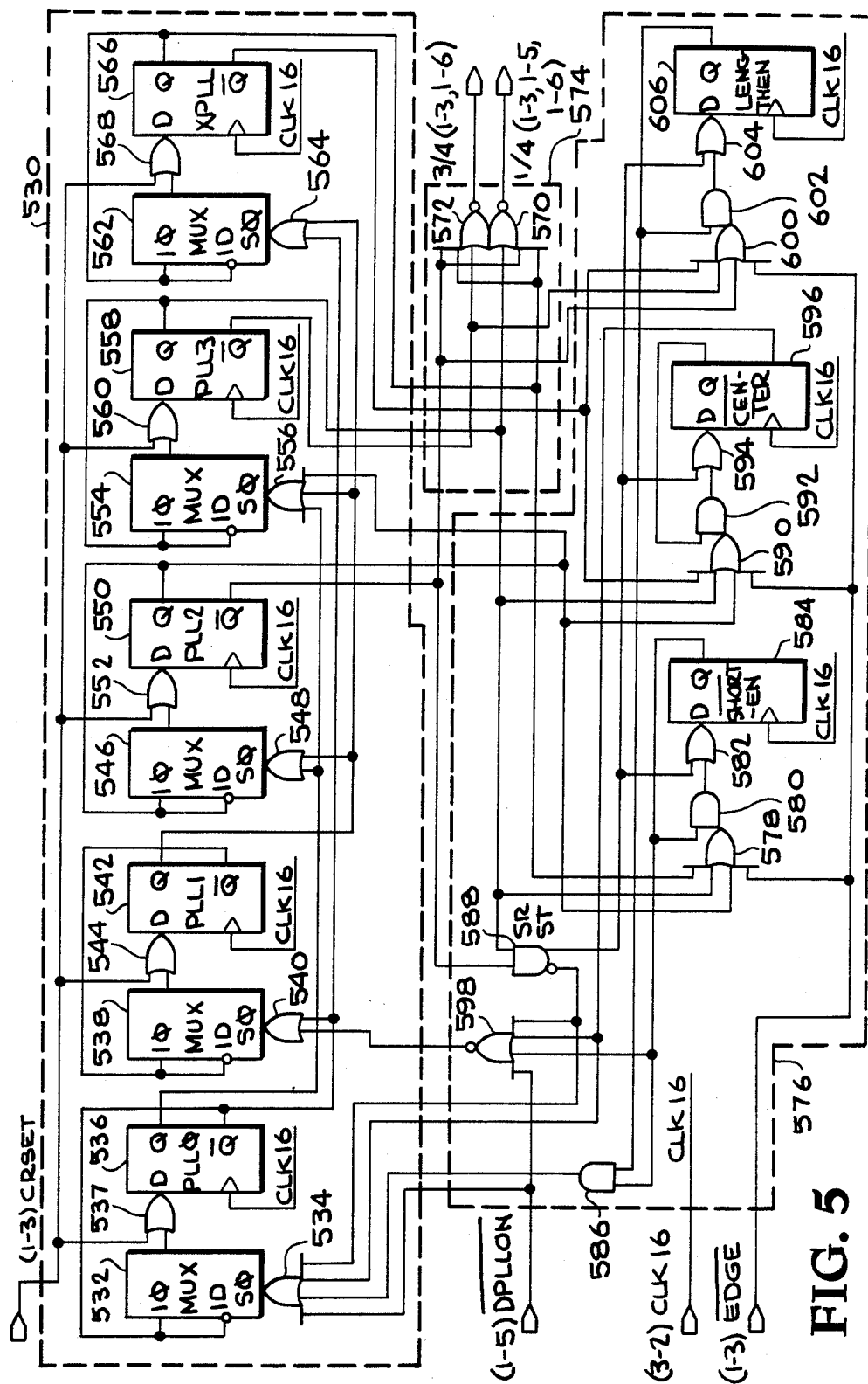
FIG. 5 is a logic diagram of the Receive Clock Recovery section of the Receiver of the present invention.

With reference to FIG. 5, the Receive Clock Recovery block 150 includes a recovered clock oscillator section 530 (152 on FIG. 1A) which receives the clock recovery preset (CRESET) signal generated by the receive supervisor section 136 and the complementary digital phase-locked loop ($\overline{DPLLON}$) signal generated by external receive clock controller section 144 and a clock signal (CLK16) from a clock internal to block 110 (not shown) with a cycle sixteen times faster than that of the clock signal recovered from the LINE DATA signals.

As shown on FIG. 5, the CRESET signal is conducted to the recovered clock oscillator section 530 which has a 5-bit counter portion which includes five D-type flip-flops and five multiplexers. A two-in, one-out multiplexer (MUX) 532 receives at a control input (S0) the signal generated at the output terminal of an OR gate 534, which signal is used by the MUX 488 to select which of the signals applied to MUX 488 at a 1Q or a complemented 1D terminal will be generated at an output of MUX 488. The OR gate 534 receives at a first input the $\overline{DPLLON}$ signal.

A PLL0 D-type flip-flop 536 receives at its data input (D) the signal generated by an OR gate 537 which, in turn, receives at a first input the CRESET signal. A second input of OR gate 537 receives the signal generated at the output terminal of MUX 532. Flip-flop 536 also receives the CLK16 signal at its clock input. The signal generated at the complemented output terminal ($\overline{Q}$) of flip-flop 536 is conducted to a true (1Q) and a complemented (1D) input terminal of MUX 532. A second two-in, one-out multiplexer (MUX) 538 receives at a control input (S0) the signal generated at the output terminal of an OR gate 540, receiving in turn at a first input the signal generated at the complement output terminal ($\overline{Q}$) of flip-flop 536, which signal (S0) is used by the MUX 538 to select which of the signals applied to MUX 538 at a 1Q or a complemented 1D terminal will be generated at an output of MUX 538. A second (PLL1) D-type flip-flop 542 receives at its data input (D) the signal generated by an OR gate 544 which, in turn, receives at a first input the CRESET signal. A second input of OR gate 544 receives the signal generated at the output terminal of MUX 538. Flip-flop 542 also receives the CLK16 signal at its clock input. The signal generated at the complemented output terminal ($\overline{Q}$) of flip-flop 542 is conducted to a true (1Q) and a complemented (1D) input terminal of MUX 538.

A third two-in, one-out multiplexer (MUX) 546 receives at a control input (S0) the signal generated by an OR gate 548 which, in turn, receives at a first input the signal generated at the output terminal (Q) of flip-flop 536, which signal is also conducted to true (1Q) and complemented (1D) inputs of MUX 532. A second input of OR gate 548 receives the signal generated at the true output terminal (Q) of flip-flop 542. The control signal is used by the MUX 546 to select which of the signals applied to MUX 546 at a 1Q or a complemented 1D terminal will be generated at an output of MUX 546. A third (PLL2) D-type flip-flop 550 receives at its data input (D) the signal generated by an OR gate 552 which, in turn, receives at a first input the CRESET signal. A second input of OR gate 552 receives the signal generated at the output terminal of MUX 546. Flip-flop 550 also receives the CLK16 signal at its clock input. The signal generated at the true output terminal (Q) of flip-flop 550 is conducted to a true (10) and a complemented (1D) input terminal of MUX 546.

A fourth two-in, one-out multiplexer (MUX) 554 receives at a control input (S0) the signal generated by an OR gate 556 which, in turn, receives at a first input the signal generated at the output terminal (Q) of flip-flop 536. A second input of OR gate 504 receives the signal generated at the true output terminal (Q) of flip-flop 542. The control signal is used by the MUX 554 to select which of the signals applied to MUX 554 at a 1Q or a complemented 1D terminal will be generated at an output of MUX 502. A fourth (PLL3) D-type flip-flop 558 receives at its data input (D) the signal generated by an OR gate 560 which, in turn, receives at a first input the CRESET signal. A second input of OR gate 560 receives the signal generated at the output terminal of MUX 554. Flip-flop 558 also receives the CLK16 signal at its clock input. The signal generated at the output terminal (Q) of flip-flop 558 is conducted to true (1Q) and complemented (1D) inputs of MUX 502.

A fifth two-in, one-out multiplexer (MUX) 562 receives at a control input (S0) the signal generated by an OR gate 564 which, in turn, receives at a first input the signal generated at the complemented output terminal ($\overline{Q}$) of flip-flop 536. A second input of OR gate 512 receives the signal generated at the output terminal (Q) of flip-flop 542. The control signal is used by the MUX 510 to select which of the signals applied to MUX 510 at a 1Q or a complemented 1D terminal will be generated at an output of MUX 510. A fifth (XPLL) D-type flip-flop 566 receives at its data input (D) the signal generated by an OR gate 568 which, in turn, receives at a first input the CRESET signal. A second input of OR gate 516 receives the signal generated at the output terminal of MUX 566. Flip-flop 556 also receives the CLK16 signal at its clock input.

The signal generated at the output terminal (Q) of flip-flop 566 (XPLL) is conducted to true (1Q) and complemented (1D) inputs of MUX 562 as well as to a first input of a NOR gate 570. NOR gate 570 receives at a second input terminal the signal generated at the true (Q) output terminal of flip-flop 558 (PLL3) and at a third input terminal the signal generated at the complemented ($\overline{Q}$) output terminal of flip-flop 550 ($\overline{PLL2}$). A ¼ signal is generated at the output terminal of NOR gate 570.

The signal generated at the output terminal (Q) of flip-flop 558 (PLL3) is conducted to true (1Q) and complemented (1D) inputs of MUX 554 as well as to a first input of a NOR gate 572. NOR gate 572 receives at a second input terminal the signal generated at the true (Q) output terminal of flip-flop 566 (XPLL) and at a third input terminal the signal generated at the complemented ($\overline{Q}$) output terminal of flip-flop 550 ($\overline{PLL2}$). A ¾ signal is generated at the output terminal of NOR gate 570. The NOR gates 570 and 572 constitute the receive clock recovery logic section 574 (154 on FIG. 1A) of block 150.

The recovered clock to data clock phase detector section 576 (156 on FIG. 1A) of Receive Clock Recovery block 150. Section 576 generates $\overline{SHORTEN}$, CENTER, $\overline{LENGTHEN}$ signals which are applied to selected OR gates 534, 540 and 556 to cause adjustments in the frequency of the clock generated by the recovered clock oscillator 530. The $\overline{EDGE}$ signal generated by the Receive Data Interpreter and Supervisor section 130 is received at a first input terminal of an OR gate 578 which receives at a second input terminal the signal generated at the true (Q) output terminal of flip-flop 558 (PLL3), at a third input terminal the signal generated at the true (Q) output terminal of flip-flop 550 (PLL2), and at a fourth terminal the signal generated at the true (Q) output terminal of flip-flop 566 (XPLL).

The output terminal of OR gate 578 is connected to a first input terminal of an AND gate 580, which in turn has its output terminal connected to a first input terminal of an OR gate 582. OR gate 582 generates at its output terminal a signal received at a data (D) input terminal of a $\overline{SHORTEN}$ D-type flip-flop 584. Flip-flop 584 receives at its clock input terminal the CLK16 signal and generates at its true (Q) output terminal a $\overline{SHORTEN}$ signal which is conducted to a second input terminal of AND gate 580 and to the first input terminal of an AND gate 586. A second input terminal of OR gate 582 receives the setreset (SRST) signal generated at a true output terminal of an AND gate 588. AND gate 588 receives at a first input terminal the $\overline{PLL3}$ signal generated by flip-flop 558 and at a second input terminal the $\overline{PLL2}$ signal generated by flip-flop 550.

The $\overline{EDGE}$ signal generated by the Receive Data Interpreter and Superviser section 130 is also received at a first input terminal of an OR gate 590 which receives at a second input terminal the signal generated at the true (Q) output terminal of flip-flop 558 (PLL3), at a third input terminal the signal generated at the true (Q) output terminal of flip-flop 550 (PLL2), and at a fourth terminal the signal generated at the complemented ($\overline{Q}$) output terminal of flip-flop 556 ($\overline{XPLL}$). The output terminal of OR gate 590 is connected to a first input terminal of an AND gate 592, which in turn has its output terminal connected to a first input terminal of an OR gate 594. OR gate 594 generates at its output terminal a signal received at a data (D) input terminal of a $\overline{CENTER}$ D-type flip-flop 596.

Flip-flop 596 receives at its clock input terminal the CLK16 signal and generates at its true (Q) output terminal a $\overline{CENTER}$ signal which is conducted to a second input terminal of AND gate 592 and at its complemented ($\overline{Q}$) output terminal a complemented $\overline{CENTER}$ signal to a first input terminal of a NOR gate 598 and to a second input terminal of OR gate 534. A second input terminal of NOR gate 598 receives the complemented setreset ($\overline{SRST}$) signal generated at a complemented output terminal of the AND gate 588. NOR gate 598 receives at a third input terminal the $\overline{SHORTEN}$ signal generated by flip-flop 584 and at a fourth input terminal the $\overline{DPLLON}$ signal generated by Receive Decode Logic block 140. The signal generated at the output of NOR gate 598 is received at a second input to OR gate 540 within oscillator section 530. A second input terminal of OR gate 534 within oscillator section 534 receives the complemented setreset ($\overline{SRST}$) signal generated at the complemented output terminal of the AND gate 588. OR gate 534 receives at a third input terminal the complementary $\overline{CENTER}$ signal generated by flip-flop 596 and at a fourth input terminal the signal generated at the output terminal of AND gate 586.

The $\overline{EDGE}$ signal generated by the Receive Data Interpreter and Superviser section 130 is also received at a first input terminal of an OR gate 600 which receives at a second input terminal the signal generated at the complemented ($\overline{Q}$) output terminal of flip-flop 558 ($\overline{PLL3}$), at a third input terminal the signal generated at the complementary ($\overline{Q}$) output terminal of flip-flop 550 ($\overline{PLL2}$), and at a fourth terminal the signal generated at the complementary ($\overline{Q}$) output terminal of flip-flop 566 ($\overline{XPLL}$).

The output terminal of OR gate 600 is connected to a first input terminal of an AND gate 602, which in turn has its output terminal connected to a first input terminal of an OR gate 604. OR gate 604 generates at its output terminal a signal received at a data (D) input terminal of a $\overline{LENGTHEN}$ D-type flip-flop 606. Flip-flop 606 receives at its clock input terminal the CLK16 signal and generates at its true (Q) output terminal a $\overline{LENGTHEN}$ signal which is conducted to a second input terminal of AND gate 602 and to a second input terminal of an AND gate 586. A second input terminal of OR gate 604 receives the setreset (SRST) signal generated at the true output terminal of AND gate 588.

Figure 6:
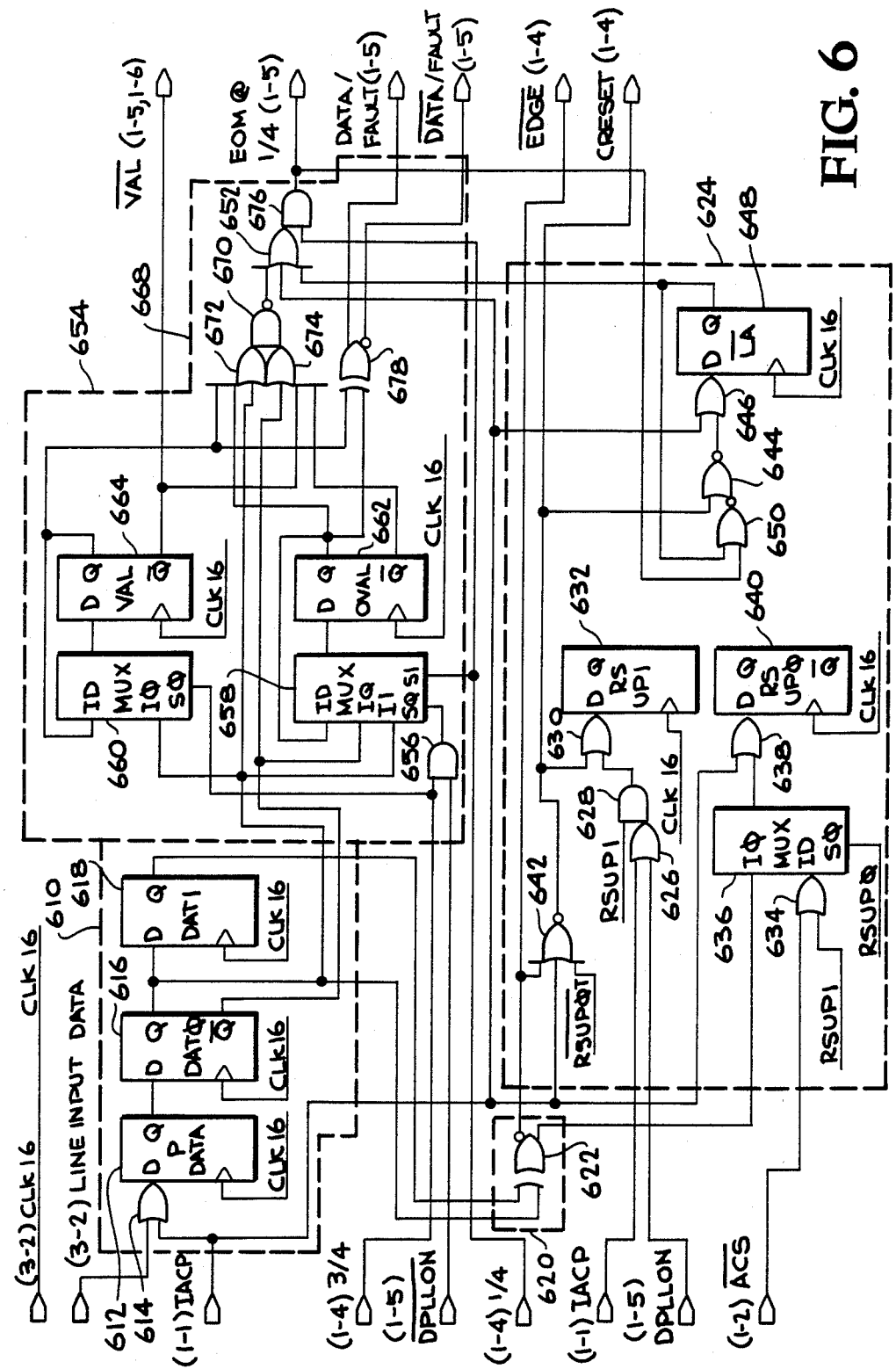
FIG. 6 is a logic diagram of the Receive Data Interpreter and Supervisor section of the Receiver of the present invention.

With reference to FIG. 6, the Receive Data Interpreter and Supervisor block 130 includes an input data synchronizer 610 (132 on FIG. 1B) which receives the LINE INPUT DATA signal and the $\overline{IACP}$ signal generated by flip-flop 440 (FIG. 3), and the CLK16 signal. A first buffering D-type flip-flop 612 receives at its data input (D) the output signal generated by an OR gate 614 which receives the LINE INPUT DATA and $\overline{IACP}$ signals. Flip-flop 612 also receives the CLK 16 signal at its clock input. A second buffering D-type flip-flop 616 receives at its data input (D) the signal generated at the true (Q) output terminal of flip-flop 612. Flip-flop 616 receives the CLK16 signal at its clock input terminal. A third buffering D-type flip-flop 618 receives at its data input (D) the DAT0 signal generated at the true (Q) output terminal of flip-flop 616, as well as the CLK16 signal at its clock input terminal.

Block 130 also include a data zero-crossing detector 620 (134 on FIG. 1B) which comprises an exculsive-OR (XOR) gate 622 which receives the DAT0 and DAT1 signals generated at the true (Q) output terminals of flip-flops 616 and 618, respectively. Gate 622 generates therefrom, at a complemented output, the $\overline{EDGE}$ signal.

Block 130 also includes the Receive Supervisor portion 624 (136 on FIG. 1B) which receives the true and complemented signals generated at the output terminals of XOR gate 622 as well as the DPLLON, $\overline{ACS}$, IACP, $\overline{IACP}$, ¼ signals described earlier in connection with blocks 110, 120 and 150 of receiver 100. An OR gate 626 receives the IACP and DPLLON signals and generates therefrom a signal received at a first input of an AND gate 628 which, in turn, generates a signal received at a first input of an OR gate 630. The output terminal of OR gate 630 is connected to the data input (D) terminal of a D-type flip-flop 632 which generates at its true (Q) output terminal an RSUP1 signal. Flip-flop 632 also receives the CLK16 signal at its clock input terminal. The RSUP1 signal is received at a second input terminal of AND gate 628, as well as a first input terminal of an OR gate 634. OR gate 634 receives at a second input the $\overline{ACS}$ signal generated by AND gate 522 (FIG. 4). The output terminal of OR gate 634 is connected to a first (1D) input terminal of a two-in, one-out multiplexer (MUX) 636 which receives at a second (1Q) input terminal the signal generated at the true output terminal of XOR gate 622. MUX 636 generates at its output terminal a signal conducted to a first input of an OR gate 638 which also receives at a second input the $\overline{IACP}$ signal.

The output terminal of OR gate 638 is connected to the data (D) input terminal of a D-type flip-flop 640 which generates at its true (Q) and complemented output terminals an RSUP0, and $\overline{RSUP0}$ signals, respectively. Flip-flop 640 also receives the CLK 16 signal at its clock input terminal. MUX 636 receives at a control (S0) the RSUP0 signal, which signal is used by the MUX 636 to select which of the signals applied to MUX 636 at its 1Q or 1D terminals will be generated at its output terminal.

The Receive Supervisor portion 624 of block 130 also includes a NOR gate 642 which receives the RSUP0, $\overline{IACP}$ and $\overline{EDGE}$ signals and generates therefrom a CRESET signal conducted to a second input terminal of OR gate 630, to Receive Clock Recovery block 150, described above, and to a first input terminal of a NOR gate 644. An OR gate 646 receives the $\overline{IACP}$ signal and the signal generated by NOR gate 644 and generates therefrom a signal conducted to the data input (D) of a D-type flip-flop 648. Flip-flop 648 also receives the CLK16 signal at its clock input and generates at its true (Q) output terminal an $\overline{LA}$ signal which is received at a first input terminal of a NOR gate 650 as well as a first input terminal of an OR gate 652, which will be described below in connection with portion 668 of block 130.

As shown on FIG. 6, Receive Data interpreter and supervisor block 130 also includes a data $\frac{1}{4},\frac{3}{4}$ cell sampler portion 654 (138 on FIG. 1B) which receives the DAT0 and $\overline{DAT0}$ signals generated by flip-flop 626 as well as the $\frac{1}{4}$, $\frac{3}{4}$ and $\overline{DPLLON}$ signals. The latter two signals are received at an AND gate 656. A three-in, one-out multiplexer (MUX) 658 receives at a first control input (S0) the signal generated at the output of AND gate 656 and at a second control input (S1) the $\frac{1}{4}$ signal, and selects thereby which of the signals applied to MUX 658 at a IQ, ID or I1 terminal will be generated at an output of MUX 658.

A two-in, one-out multiplexer (MUX) 660 receives the DPLLON signal at its control input (S0), which is used to select which of the signals applied to MUX 660 at a 1D or 10 terminal will be generated at an output of MUX 660. The $\overline{DAT0}$ signal is applied to the I1 and I1 input terminals of MUX 658 and MUX 660, respectively. The DAT0 signal is applied to the IQ input terminal of MUX 658. A D-type flip-flop 662 receives at its data input (D) the signal generated at the output terminal of MUX 658 and the CLK 16 signal at its clock input. Flip-flop 662 generates at its true (Q) and complemented ($\overline{Q}$) output terminals OVAL and $\overline{OVAL}$, respectively, signals. The OVAL signal is received at the ID input terminal of MUX 658. A D-type flip-flop 664 receives at its data input (D) the signal generated at the output terminal of MUX 660 and the CLK16 signal at its clock input. Flip-flop 664 generates at it true (Q) and complemented ($\overline{Q}$) output terminals VAL and $\overline{VAL}$ signals, respectively. The $\overline{VAL}$ signal is received at the ID input terminal of MUX 660.

Finally, block 130 of receiver 100 includes a data cell status decoder portion 668 (139 on FIG. 1B) which includes the aforementioned OR gate 652. Gate 652 receives at a second input terminal the IACP signal and at a third input terminal the signal generated at the output terminal of a NAND gate 670 which, in turn, receive the signal generated at the output of OR gates 672 and 674. OR gate 672 receives the VAL, OVAL and DAT0 signals; OR gate 674 receives the DAT0, $\overline{VAL}$ and $\overline{OVAL}$ signals. An AND gate 676 receives the signal generated by OR gate 652 and the $\frac{1}{4}$ signal, and generates therefrom the EOM@$\frac{1}{4}$ signal, which is conducted to a second input terminal of OR gate 650 as well as to the Receive Decode Logic block 140.

Portion 668 also includes an XOR gate 678 which receives the VAL and OVAL signals and generates therefrom a DATA/FAULT and a $\overline{DATAFAULT}$ signal at its true and complemented output terminal, respectively.

Figure 7A:
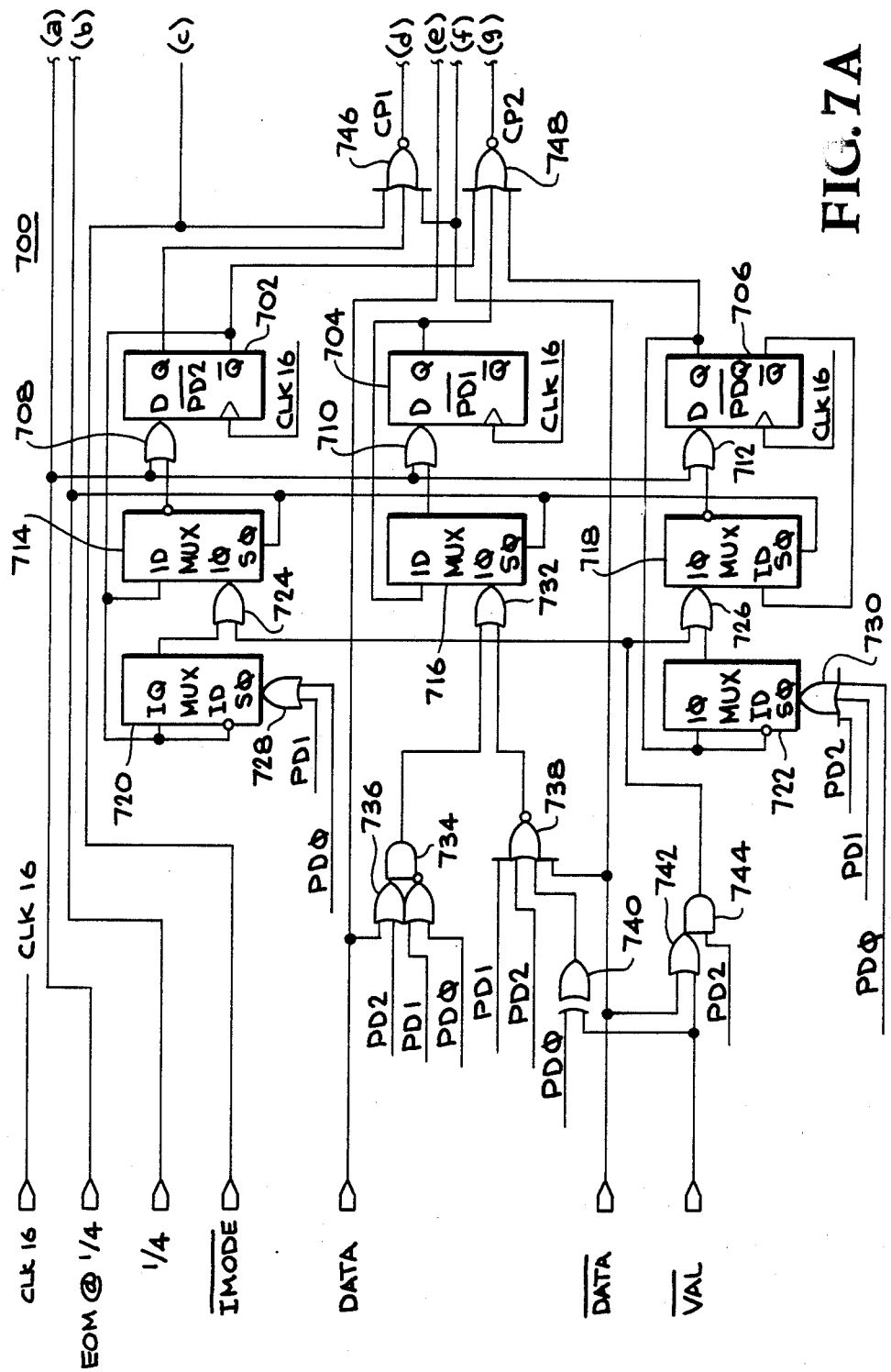

The logic diagram of Receive Decode Logic block 140 of Receiver 100 is shown in FIGS. 10A and 10B. A preamble detector portion 700 (142 on FIG. 1B) is shown in FIG. 7A, which receives the CLK16, EOM@$\frac{1}{4}$, $\frac{1}{4}$, DATA, $\overline{DATA}$, and $\overline{VAL}$ signals described earlier in connection with blocks 110, 120, 130 and 150 of Receiver 100, and the $\overline{IMODE}$ signal to be described hereinafter. A set of three flip-flops 702, 704, and 706 provide a three inter-bit delay by generating at their true (Q), and complement ($\overline{Q}$), outputs preamble detector timing signals PD2 and $\overline{PD2}$, PD1 and $\overline{PD1}$, PD0 and $\overline{PD0}$, respectively. As shown in FIG. 7A, flip-flops 702, 704 and 706 receive at their data (D) input terminals the signals generated an OR gate 708, 710, 712, respectively, which, in turn, receive at a first input the EOM@$\frac{1}{4}$ signal and at a second input the signal generated at an output of a two-in, one-out multiplexer (MUX) 714, 716, 718, respectively. Flip-flops 702, 704, and 706 receive the CLK16 signal at their clock inputs. MUX 714, 716 and 718 each receive at a control input (S0) the $\overline{IMODE}$ signal, which signal is used by the MUX to which of the signals applied at their 1Q or 1D terminals will be generated at their respective output terminals.

MUX 714 and 716 receive at their 1D input terminals the output generated at the $\overline{Q}$, respectively, Q, output terminal of flip-flop 702, 706, respectively. A two-in, one output MUX 720, 722, respectively, generate at their output terminals a signal received at a first input terminal of an OR gate 724, 726, respectively, which in turn, generates a signal received at the 1D, 10, respectively, input terminal of MUX 714, 718, respectively. The signal generated at the Q output terminal of flip-flop 706 is received at the true (10) and complemented (1D) input terminals of MUX 722, and the signal generated at the $\overline{Q}$ output terminal of flip-flop 706 is received at the 1D input terminal of MUX 718.

MUX 720, 722, respectively, receives at its control input (S0) the output signal generated by an OR gate 728, 730, respectively, receiving, in turn the PD1 and PD0 signals, the PD0, P1 and $\overline{\text{PD2}}$ signals, respectively. The MUX 716 receives at its 10 input terminal the signal generated by an OR gate 732. OR gate 732 receives at a first input terminal the signal generated by an AND gate 734 which, in turn, receives at a first input terminal the signal generated by an OR gate 736 which receives the DATA and PD2 signals and at second complemented input terminal the signal generated by an OR gate 738 which receives the PD1, PD2, DATA signals and the signal generated by an XOR gate 740. XOR gate, turn, receives the PD0 and $\overline{\text{VAL}}$ signals.

The $\overline{\text{DATA}}$ and $\overline{\text{VAL}}$ signals are received by an OR gate 742 which generates therefrom a signal conducted to a first input terminal of an AND gate which receives the PD2 signal at a second input terminal. The signal generated by AND gate 744 is conducted to a second input terminal of OR gates 724 and 726.

Preamble Detector 700 generates at NOR gates 746 and 748, CP1 and CP2 signals, respectively, each receiving the IMODE, PD2 and $\overline{\text{DATA}}$ signals, and the PD2, PD1 and $\overline{\text{PD0}}$ signals, respectively. The CP1 and CP2 signals are conducted to the External Receive Clock Controller 750 (144 on FIG. 1B) and the CP2 signal to the Receiver Data Controller 752 (146 on FIG. 1B), as shown on FIG. 7B.

Section 750 includes a flip-flop 754 receives at its data (D) input the signal generated by an OR gate 756 which, in turn, receives at a first input terminal the signal generated by a two-input, one-output MUX 758. MUX 758 receives at its control input (S0) the ¼ signal, which signal is used to select which of the signals applied to MUX 758 at its 1Q or 1D terminal will be generated at its output terminal. A second input terminal of OR gate 756 receives the signal generated at the output of a AND gate receiving, in turn, the EOM@¼ signal and the signal generated at the output of an OR gate 762 receiving at a first input the DP1 signal generated at the (Q) output of flip-flop 754. Flip-flop 754 also receives the CLK16 signal at its clock input. The DP1 signal generated at the $\overline{\text{Q}}$ output terminal of flip-flop 754 is conducted to the 1D input terminal of MUX 758 and to a first input of an OR gate 760. OR gate 760 generates at a true output terminal the DPLLON signal and at complemented output terminal the $\overline{\text{DPLLON}}$ signals. A two-input, one-output MUX 762 receives at its control input terminal (S0) the CP1 signal, which signal is used to select which of the signals applied to its 1Q or 1D output terminal will be generated at its output, which is conducted to a first input of an OR gate 764. Gate 764 receives the $\overline{\text{IMODE}}$ signal at a second input and generates therefrom a signal conducted to the 10 input terminal of MUX 758. MUX 762 receives at its 10 input the DP0 signal.

Section 750 also includes a flip-flop 766 receiving at its data (D) input terminal the signal generated by an OR gate 768, which, in turn, receives the EOM@¼ signal and the signal generated at the complemented output of a two-input, one-output MUX 770. Flip-flop 766 generates at its complemented ($\overline{\text{Q}}$) output terminal a DCI signal which is received at the 1D input terminal of MUX 770. Flip-flop 766 also receives the CLK16 signal at its clock input. MUX 770 receives at its control input (S0) the $\overline{\text{IMODE}}$ signal, which signal is used to select which of the signals applied to MUX 770 at its 1Q or 1D terminal will be generated at a (complemented) output of MUX 770. Section 750 also includes an OR gate 772 which receives at a first input terminal the DC1 signal generated by flip-flop 770 and generates at a true output terminal a signal received at a first input terminal of an OR gate 774 which, in turn, generates a signal received by the 10 input of MUX 770. OR gate 774 receives at a second input terminal the signal generated by an AND gate 776 which receives at a first input the DATA signal and at a second input the signal generated by an OR gate 778 which, in turn, receives the CP1 and CP2 signals. OR gate 772 generated at a complemented output terminal the DEN signal.

As shown on FIG. 7B, section 752 includes a flip-flop 780 received at its data (D) input the signal generated by a two-input, one-output MUX 782. MUX 782 receives at its control input (S0) the ¼ signal, which signal is used to select which of the signals applied to MUX 758 at its 1Q or 1D terminal will be generated at its output terminal. The DP0 signal generated at the Q output terminal of flip-flop 780 is conducted to the 1D input terminal of MUX 782. The signal generated at the complemented ($\overline{\text{Q}}$) terminal of flip-flop 780 is conducted to a second input of an OR gate 760.

Section 572 also includes a flip-flop 784 receiving at its data (D) input terminal the signal generated by an OR gate 786, which, in turn, receives the EOM@¼ signal and the signal generated at the complemented output of a two-input, one-output MUX 788. Flip-flop 784 generates at its complemented ($\overline{\text{Q}}$) output terminal a DC0 signal which is received at the 1D input terminal of MUX 788. Flip-flop 784 also receives the CLK16 signal at its clock input. MUX 788 receives at its control nput (S0) the $\overline{\text{IMODE}}$ signal, which signal is used to select which of the signals applied to MUX 788 at its 1Q or 1D terminal will be generated at a (complemented) output of MUX 788. Section 750 also includes an OR gate 790 which receives at a first input terminal the DC1 signal generated by flip-flop 772 and generates at an output terminal a signal received by the 10 input of MUX 788. OR gate 790 receives at a second input terminal the signal generated by an AND gate 792 which receives at a first input the $\overline{\text{DATA}}$ signal and at a second input the signal generated by an OR gate 794 which, in turn, receives the DC1 and CP2 signals. The signal generated at the $\overline{\text{Q}}$ terminal of flip-flop 780 is conducted to a second input terminal of OR gate 760 and the $\overline{\text{DP0}}$ signal generated at the Q terminal of flip-flop 780 is conducted to the 10 input terminal of MUX 762 and a second input of OR gate 762 and the signal generated at the true (Q) output terminal of flip-flop 784 is conducted to a second input terminal of OR gate 772.

Figure 1A:
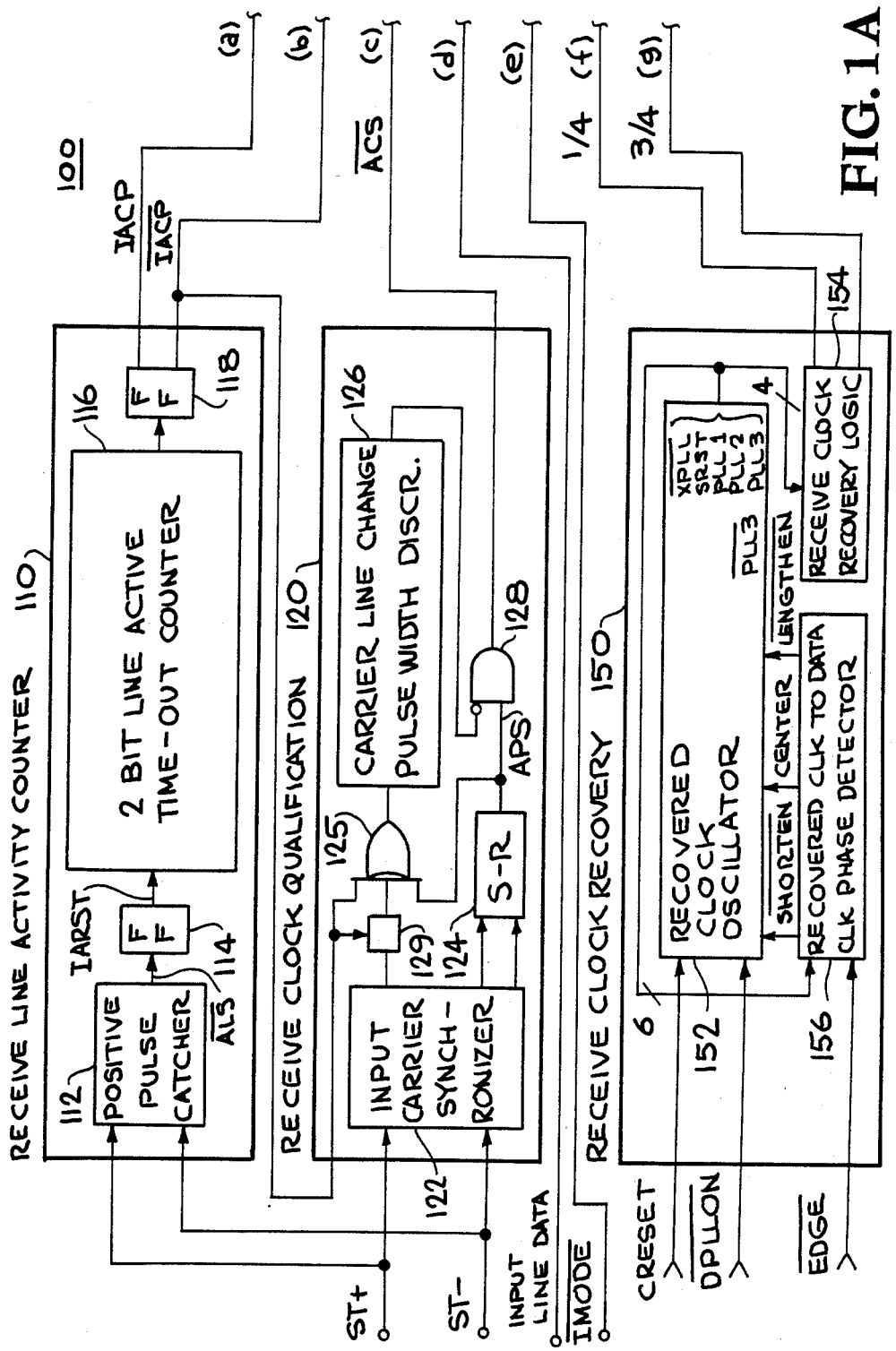
FIGS. 1A and 1B are a functional block diagram of a Manchester-encoded Receiver according to the present invention.
Figure 1B:
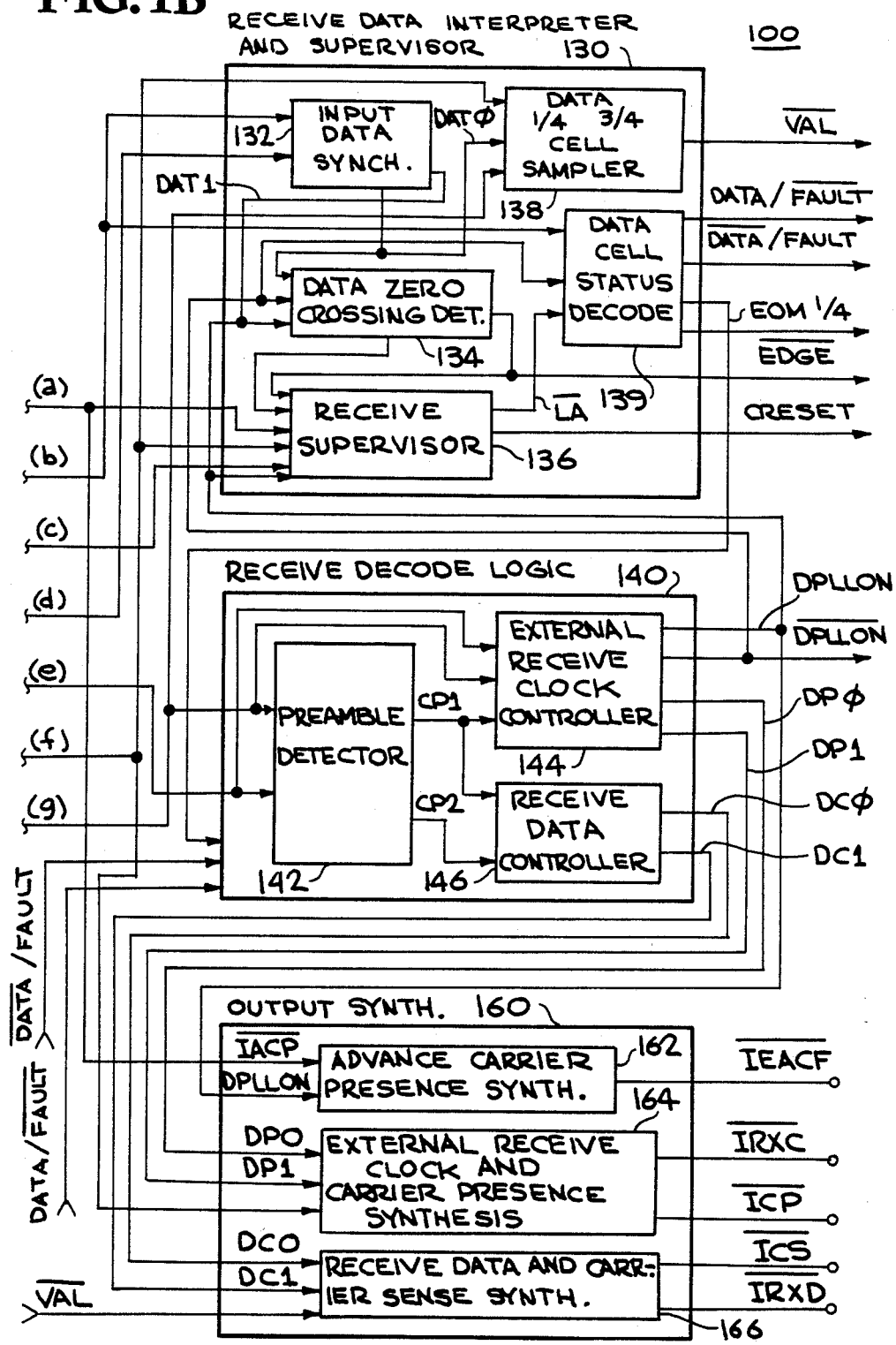
Figure 8:
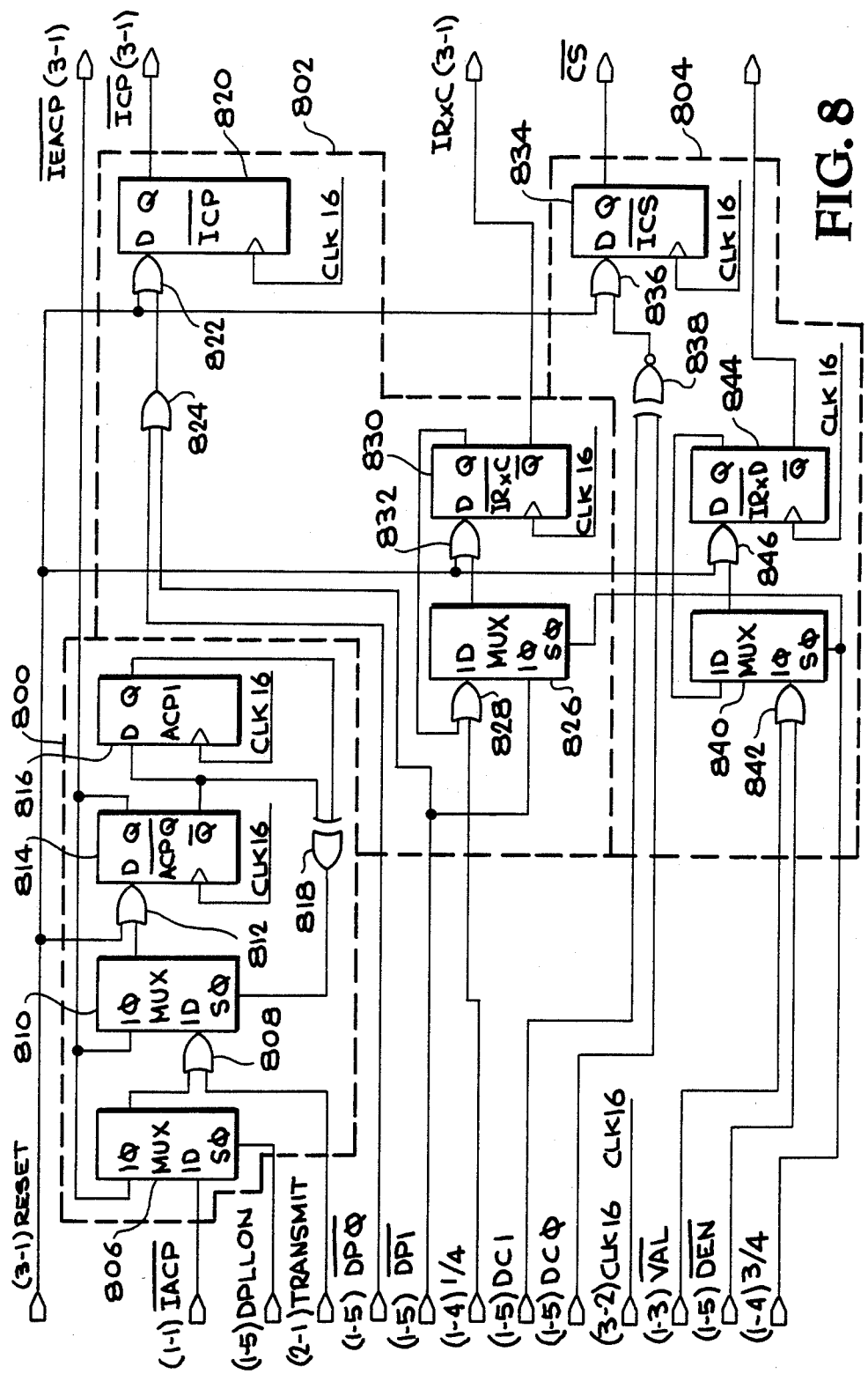
FIG. 8 is a logic diagram of the Receive Output Synthesizers section of the Receiver of the present invention.

Finally, the logic diagram of Output Synthesizer block 160 of Receiver 160 is shown on FIG. 8; consisting of an Advanced Carrier Presence Synthesizer portion 800 (162 on FIG. 1B), an External Receive clock and Carrier presence synthesis portion 802 (164 on FIG. 1B) and a Receive Data and Carrier Sense Synthesizer portion 804 (166 on FIG. 1B).

As shown on FIG. 8, portion 800 includes a two-input, one-output MUX 806 which receives the DPLLON signal at a control input (S0) which signal is used by MUX 806 to select which of the signals applied to MUX 806 at a 1Q or a 1D terminal will be generated at an output of MUX 806. The $\overline{\text{IACP}}$ signal is applied to the 1D terminal of MUX 806. An OR gate 808 receives the output signal generated by MUX 806 and the TRANSMIT signal and generates therefrom a signal received at a 1D input of a two-input, one-output MUX 810. An OR gate 812 receives the signal generated at the output terminal of MUX 810 and the RESET signal and generates therefrom a signal received at a data (D) input of a D-type flip-flop 814 which generates a complemented advanced carrier presence ($\overline{ACP}$) signal at its (Q) output terminal which signal is conducted to the 10 input terminals of MUX 806 and 810. Flip-flop 814 generates at its $\overline{Q}$ output terminal a signal received at a data (D) input of a D-type flip-flop 816 as well as at a first input of an XOR gate 818. Flip-flop 816 generates at its (Q) output terminal a signal conducted to a second input of XOR gate 818, which generates therefrom a signal conducted to the S0 control input of MUX 810. The flip-flops 814 and 816 each receive the CLK16 signal at their clock input terminals.

Portion 802 includes a D-type flip-flop 820 which receives at its data (D) input the signal generated by an OR gate 822 which, in turn, receives the RESET signal and the signal generated by an OR gate 824 receiving the $\overline{DP0}$ and $\overline{DP1}$ signals. Flip-flop 820 receives the CLK16 signal at its clock input terminal. Flip-flop 820 generates at its Q output terminal the complemented carrier presence ($\overline{CP}$) signal. Portion 802 also includes a two-input, one-output MUX 826 which receives at its control input (S0) the ¾ signal; which signal is used by the MUX 826 to select which of the signals applied at a 1Q or a 1D terminal will be generated at an output of MUX 826. The 10 terminal of MUX 826 receives the $\overline{DP1}$ signal and the 1D terminal receives the signal generated by an OR gate 828 which, in turn, receives at a first input terminal the ¼ signal and at a second input terminal the signal generated by a D-type flip-flop 830 at its Q output terminal. Flip-flop 830 receives at its data (D) input the signal generated by an OR gate 832 which receives, in turn, the reset signal and the signal generated at the output terminal of MUX 826. Flip-flop 830 also receives the CLK16 signal at its clock input and generates at its $\overline{Q}$ output the RXC signal.

Portion 804 includes a D-type flip-flop 834 which receives at its data (D) input the signal generated by an OR gate 836 which, in turn, receives the RESET signal and the signal generated at the complemented output terminal of an XOR gate 838 receiving the $\overline{DC0}$ and $\overline{DC1}$ signals. Flip-flop 834 receives the CLK16 signal at its clock input terminal. Flip-flop 834 generates at its Q output terminal the complemented carrier sense ($\overline{CS}$) signal. Portion 804 also includes a two-input, one-output MUX 840 which receives at its control input (S0) the ¾ signal; which signal is used by the MUX 840 to select which of the signals applied at a 1Q or a 1D terminal will be generated at an output of MUX 840. The 10 terminal of MUX 840 receives the signal generated by an OR gate 842 which, in turn, receives the $\overline{VAL}$ and $\overline{DEN}$ signals and a 10 terminal receives the signal generated by a D-type flip-flop 844 at its Q output terminal. Flip-flop 844 receives at its data (D) input the signal generated by an OR gate 846 which receives, in turn, the RESET signal and the signal generated at the output terminal of MUX 840. Flip-flop 844 also receives the CLK16 signal at its clock input and generates at its $\overline{Q}$ output the RXD signal.

C. Internal Signal Characteristics of the Manchester-encoded Receiver

The Manchester-encoded Receiver 100 of the instant invention generates several key internal interface signals. Related to the detection of lie activity function of the Receiver 100 are the following internal signals: internal advance carrier presence (IACP) which indicates if there is line activity. A line signal having a differential voltage greater than the positive carrier presence level or less than the negative carrier presence level will cause Receiver 100 to set IACP HIGH and to retain this value until there is no line signal having such a differential voltage for two consecutive bit times.

A second internal signal is advanced carrier sense (ACS) which indicates if the line activity which caused the Receiver 100 to set IACP HIGH is valid Manchester-encoded data. The Receiver 100 sets $\overline{ACS}$ HIGH if the detected line signal has a differential voltage greater than the positive carrier presence level followed within a window of ¾ to 1¼ bit times by a voltage less than the negative carrier presence level, or if the line signal has a differential voltage less than the negative carrier presence level followed within the window by a voltage greater than the positive carrier presence level. The ACS signal is set HIGH only when IACP is HIGH or during the first clock interval after IACP has been set LOW.

An edge (EDGE) internal signal is set HIGH whenever the Receiver 100 detects a ZERO-crossing by the input line data. A clock recovery preset (CRESET) signal is set HIGH for one clock cycle following the next line data edge (EDGE HIGH) after the line activity is detected, (IACP HIGH), and the data qualification is complete (ACS HIGH). CRESET is set HIGH once during reception of input line data by Receiver 100. A line acquisition (LA) signal is set HIGH following CRESET set HIGH until a physical (line quiet) or logical (decoded) end-of-message.

The data-sampling signals ¼ and ¾ are used to determine whether the line input data is valid Manchester-encoded. The line data is sampled at a ¼ and a ¾ interval from the start of an the current intra-bit time interval. A DATA signal is set HIGH if the decoded line data is valid Manchester-encoded based on the opposite logical polarity at the ¼ and ¾ sample-times. A logical end-of-message (EOM ¼) is set HIGH whenever no line activity is detected and will be reset LOW when CRESET is set HIGH and will remain LOW until the logical end of message or LA is set LOW.

A digital phase-locked loop on (DPLLON) signal is set HIGH on the ¼ sample interval after the CRESET and LA signals have been set HIGH. The HIGH DPLLON signal indicator that the line activity detection function of the Receiver 100 has been accomplished and that the Receive Supervisor can start to generate the external receive output signals R×C and R×D. Accordingly, a HIGH DPLLON signal must be followed by a resetting of DPLLON to LOW before the Receiver 100 can begin line activity detection again.

D. Clock Recovery Method for Manchester-Encoded Signals

With reference to FIGS. 1A and 1B, the CRESET and EDGE signals generated by the Receive Data Interpreter and Supervisor 130 and the DPLLON signal generated by the Receive Decode Logic 140 portions of receiver 100 are applied to a Receive Clock Recovery 150 block of receive 100. Briefly, the method used by Receive Clock Recovery 150 is that a recovered clock oscillator portion 152 (530 on FIG. 5) of block 150 is asynchronous at a frequency approximately 16 times the inter-bit frequency of the line input data until a HIGH CRESET signal is received from the receive supervisor portion 136 of block 130. At this time, which will be at approximately the midpoint of the first Manchester-encoded cell received following detection of line activity ($\overline{IACP}$ HIGH), the recovered clock oscillator 152 is initially synchronized to the received data cell center. However, the clock 152 is still free-running, i.e., no tracking of the input data, as will be described below.

A Receive Clock recovery logic portion 154 (574 on FIG. 5) receives four signals; an extra phase locked loop (XPLL) signal, a complemented phase-locked-loop 2 ($\overline{PLL2}$) signal, and true and complemented phase-locked-loop 3 (PLL3, $\overline{PLL3}$) signals generated by flip-flops 566, 550, and 558, respectively of the recovered clock oscillator 152. A pair of NOR gates (570 and 572 on FIG. 5) internal to logic circuit 154 receive the XPLL, PLL3 and $\overline{PLL2}$, and XPLL, $\overline{PLL3}$ and PLL2, respectively. The first NOR gate 570 generates a ¼-sample signal therefrom approximately ¼ of a bit period after the first Manchester-encoded cell is perceived to have received by the receive supervisor 136. (The second NOR gate 572 generates a ¾-sample signal; as will be described below.)

The HIGH $\overline{DPLLON}$ signal generated by the internal receive clock controller 144 after the ¼ of a bit period following the first Manchester-encoded cell (i.e., following the generation of a HIGH CRESET) is applied to the recovered clock oscillator 152 thereby enabling it to follow the tracking of the input data as performed by a recovered-clock to data-clock phase detector portion 156 (576 on FIG. 15) of receive clock recovery block 150.

Recovered-clock to data-clock phase detector 156 receives the $\overline{EDGE}$ signal generated by the Receive Data Interpretor and Supervisor 130 as well as the XPLL, $\overline{PLL2}$, PLL3 and $\overline{PLL3}$ signals described above and a shift register reset (SRST) and a true phase-locked-loop 3 (PLL3), generated by the recovered clock oscillator 152. Recovered-clock to data-clock phase detector 156 tracks the INPUT DATA by monitoring the $\overline{EDGE}$ signal generated by data zero-crossing detector 134 portion (622 on FIG. 6) of block 130, by receiving the $\overline{EDGE}$ at each of three window-generating portions of detector 156; a shorten-window register (584 on FIG. 5), a center-window register (596 on FIG. 5), and a lengthen-window register (606 on FIG. 5). The shorten-window occurs after 5/16 to 7/16 of the middle of the clock-signal period generated by the recovered clock oscillator 152, the center-window occurs after ½ of the recovered clock mid-period, and the length-window occurs after 9/16 to 11/16 of the recovered clock mid-period.

The method used by the Receive Clock Recovery 150 of the present invention is to adjust the recovered clock oscillator by tracking the data edge ($\overline{EDGE}$) signal to determine if $\overline{EDGE}$ leads, synchronizes with, or lags the center-window. The $\overline{EDGE}$ signal occuring within the shorten-window, the center-window, or the lengthen-window is stored on the corresponding register.

The shorten-register comprises an internally-clocked delay flip flop 584 generating a $\overline{SHORTEN}$ signal at its Q output, and receiving via an OR gate 578, the $\overline{EDGE}$, PLL2, PLL3 and XPPL signals. The output of this OR gate is AND-gated (by gate 580) with the present signal generated at the flip flop output, $\overline{SHORTEN}$. The signal at the output the AND gate 580 is passed through a second OR gate 582 connected to the D input of the flip-flop 584 comprising the shorten-window register. A HIGH SRST signal generated within the Recovered Clock Oscillator 152 portion, indicating that the ¾-sampling interval has been completed, is received at a second input to the second OR gate 582 thereby resetting the shorten flip-flop. In this manner the phase of the clock generated by oscillator 152 is adjusted only after the ¾-sample signal is generated.

The Boolean equations governing the operation of the shorten-register 584 is accordingly:

$$\overline{SHORTEN}_{n+1} = (XPLL + PLL3 + PLL2 + \overline{EDGE})$$

i.e., $$SHORTEN_{n+1} = \overline{XPLL} \cdot \overline{PLL3} \cdot \overline{PLL2} \cdot EDGE$$

Hence a HIGH SHORTEN signal will be generated at the next internal clock following the ¾-sampling (i.e., at 13/16 of the interbit-period from the mid-period) if the EDGE signal is received coincident with all three LOW phase locked-loop signals generated by oscillator block 152 indicating that none of the stages of the counter implementing the recovered clock oscillator 152 had been set simultaneously with or prior to reception of the $\overline{EDGE}$ signal. This situation occurs when the received clock recovery block 150 is not overrunning reception of the next zero-crossing of the INPUT DATA as determined by the data zero-crossing detector 134. Accordingly, a LOW $\overline{SHORTEN}$ signal is applied to recovered clock oscillator 152 which will cause the oscillator 152 to make a 1/16 inter-bit period increase adjustment in the next clock period generated by oscillator 152, provided a LOW CENTER signal is also applied to the oscillator 152, as will be explained below.

The center-register similarly comprises an internally-clocked delay flip flop 596 generating a CENTER signal at its Q output and a $\overline{CENTER}$ signal at its Q output, and logic circuitry receiving the $\overline{EDGE}$, PLL2, PLL3 and $\overline{XPLL}$ signals as well as the SRST signal. The Boolean equations governing the operation of the center-register is accordingly:

$$\overline{CENTER}_{n+1} = (XPLL + PLL3 + PLL2 + \overline{EDGE})$$

i.e., $$CENTER_{n+1} = XPLL \cdot \overline{PLL3} \cdot \overline{PLL2} \cdot EDGE$$

Hence a HIGH CENTER signal will be generated at the next internal clock following the ¾-sampling if the EDGE signal is received coincident with the generation of a HIGH signal for only the first two phase-locked loop signals generated by oscillator block 152, indicating either synchronization with the reception of the $\overline{EDGE}$ signal, or not overrunning of the $\overline{EDGE}$ signal. The HIGH CENTER signal is applied to recovered clock oscillator 152.

Similarly the lengthen-register is governed by the Boolean equations:

$$\overline{LENGTHEN}_{n+1} = (XPLL + PLL3 + PLL2 + \overline{EDGE})$$

i.e., $$LENGTHEN_{n+1} = \overline{XPLL} \cdot PLL3 \cdot PLL2 \cdot EDGE$$

Hence a HIGH LENGTHEN signal will be generated at the next internal clock following the ¾-sampling if the EDGE signal is received coincident with HIGH signals for all three phase-locked loop signals being generated by oscillator block 152, indicating an overrunning of the reception of the $\overline{\text{EDGE}}$ signal from the zero-crossing detector 134. Accordingly, a LOW $\overline{\text{LENGTHEN}}$ signal is applied to oscillator 152 which will cause the oscillator 152 to make a 1/16 inter-bit period decrease in the next clock period generated thereby, provided a LOW CENTER signal is also applied as will now be explained.

The $\overline{\text{SHORTEN}}$ and $\overline{\text{LENGTHEN}}$ signals generated by recovered-clock to data-clock phase detector 156 are applied to an AND gate 586 within the recovered clock oscillator 152 and the $\overline{\text{SHORTEN}}$ and CENTER signals generated by detector 156 are applied to a NOR gate 598 within oscillator 152. The output signal generated by the AND gate 586 is conducted to an OR gate 534 also receiving the CENTER signal and the $\overline{\text{DPLLON}}$ and $\overline{\text{SRST}}$ signals. The output signal generated by this OR gate 534 is applied to selection input of multiplexing latch 532 of the least-significant stage of a counter forming the recovered clock oscillator 152.

The NOR gate 598 within oscillator 152 also receives the $\overline{\text{SRST}}$ signal and the $\overline{\text{DPLLON}}$ signal and the output signal generated by the NOR gate 598 within oscillator 152 is conducted to a second OR gate 540 within oscillator 152 also receiving the $\overline{Q}$ output generated by an internally-clocked delay flip flop 536 connected to the least-significant latch of the counter. The output of this second OR gate 540 is applied to a selection input of a multiplexing latch 538 of the next-to-least-significant stage of the counter. In this manner, the state-transitions within the counter are changed to reflect a shortened or lengthened clock cycle, as will be described below in connection with Table I.

Accordingly, if both the $\overline{\text{SHORTEN}}$ and $\overline{\text{LENGTHEN}}$ signals of the CENTER signal generated by phase detector 156 are a HIGH, no correction of the clock generated by oscillator 152 is made and the state-transitions during the next clock cycle are the same as during the preceding clock cycle, as will be described in connection with Table I, below.

Alternatively, if either the $\overline{\text{SHORTEN}}$ or $\overline{\text{LENGTHEN}}$ signals generated are a LOW and the CENTER signal is also a LOW, the state-transition is modified by the inverting the output of the latch 538 for the next-to-least-significant stage of the counter comprising the recovered clock oscillator 152.

The counter within the recovered clock oscillator 152 (530 on FIG. 5) consists of a four-stage digital phase-locked-loop circuit with each stage comprising a multiplexing latch 532, 538, 546 and 554 connected via an OR gate 537, 544, 552 and 560, respectively, to the input of an associated internally-clocked delay flip flop generating the true, and complemented, a least significant phase-locked loop 0 (PLL0, $\overline{\text{PLL0}}$) flip-flop 536, phase-locked loop 1 (PLL1, $\overline{\text{PLL1}}$) 542, phase-locked loop 2 (PLL2, $\overline{\text{PLL2}}$) flip-flop 550, a most-significant phased-locked loop 3 (PLL3, $\overline{\text{PLL3}}$) flip-flop 558, and extra phase-locked loop (XPLL, $\overline{\text{XPLL}}$) flip-flop 566 signals at Q, $\overline{Q}$ outputs, respectively. The CRESET signal is received at the second input of the OR gate 537, 544, 552 and 560, respectively connected to each input of the delay flip flop so that a HIGH CRESET signal resets the counter.

The selection inputs of the least-significant and next-to-least significant multiplexing latches 532 and 538 are as described above. The selection input to the latch associated with the flip-flop 550 generating the $\overline{\text{PLL2}}$, PLL2 signals is formed by an OR gate 548 receiving the PLL1 and PLL0 signals. That of the latch 554 associated with the flip-flop 558 generating the PLL3, $\overline{\text{PLL3}}$ signals is formed by an OR gate 556 receiving the PLL2, PLL1 and the PLL0 signals. Finally, that of the latch 562 associated with the flip flop 566 generating the XPLL, $\overline{\text{XPLL}}$ signals is formed by an OR gate 564 receiving the PLL1 and $\overline{\text{PLL0}}$ signals.

These interconnections result in a clock recovery state machine describing the operation of the recovered clock oscillator 152 as shown in Table I, below, in which the value of the true signals XPLL, PLL3, PLL2, PLL1, PLL0 are indicated as "L" for LOW and "H" for HIGH.

TABLE I

State Machine for the Recovered Clock Oscillator

| Signals Generated | | | | |
|---|---|---|---|---|
| XPLL | PLL-3,2,1,0 | Transition | State Name | Input Signal |
| H | LHHH | P5 | P4 | |
| H | LHHL | P6 | P5 | |
| H | LHLH | S0 | P6 | |
| L | LHLL | W10 | S0 (¼) | |
| L | LLHH | W11 | W10 (Window | |
| L | LLHL | W12 | W11 for | |
| L | LLLH | W20 | W12 SHORTEN) | |
| H | LLLL | W30 | W20 (CENTER) | |
| H | HHHH | W31 | W30 (Window | CRESET |
| H | HHHL | W32 | W31 for | |
| H | HHLH | S1 | W32 LENGTHEN) | |
| L | HHLL | P0 | S1 (¾) | |
| L | HLHH | P0,P1,P2 | P0(Start SRST) | LENGTHEN |
| L | HLHL | P2 | P1 | CENTER |
| L | HLLH | P3 | P2 | SHORTEN |
| H | HLLL | P4 | P3(Stop SRST) | |

With reference to Table I, the fourth line refers to the state S at which a ¼ sample signal is generated by the receive clock recovery logic 154 using the output of a NOR gate receiving the XPLL, PLL3 and $\overline{\text{PLL2}}$ signals, which as shown in the fourth line are all LOW at the state S0 and accordingly will cause a HIGH ¼-sample signal to be generated by the receive clock recovery logic 154 only at this state.

Lines five, six and seven correspond to the SHORTEN window and by reference to the Boolean equation, above, for SHORTEN$_{n+1}$, show that during the corresponding shorten-window states W10, W11 and W12, the three signals $\overline{\text{XPLL}}$, PLL3 and $\overline{\text{PLL2}}$ will be HIGH and therefore, a HIGH EDGE signal received during any of these states will cause the HIGH SHORTEN signal to be generated, as required by the Boolean equation.

Similarly, the eighth line of Table I corresponds to the CENTER window state W20 and by reference to the Boolean equation, above, for CENTER$_{n+1}$, will show that during the state W10, the three signals XPLL, $\overline{\text{PLL3}}$ and $\overline{\text{PLL2}}$ will be a HIGH and therefore, a HIGH EDGE signal received during the W20 state will cause the HIGH CENTER signal, to be generated, as required by the Boolean equation.

Finally, the ninth, tenth and eleventh lines of Table I correspond to the LENGTHEN window and by reference to the Boolean equation, above, for LENGHTEN, show that during the corresponding lengthen-window states W30, W31 and W31, the three signals XPLL, PLL3 and PLL2 will be HIGH and therefore, a HIGH EDGE signal received during any of these states will cause the HIGH LENGTHEN signal to be generated, as required by the Boolean equation.

The twelfth line of Table I refers to the state S1 at which a ¾-sample signal is generated by the receive clock recovery logic 154 using the output of a NOR gate 572 receiving the XPLL, $\overline{\text{PLL3}}$ and $\overline{\text{PLL2}}$ signals, which as shown in the twelfth line are all LOW at the state S1 and accordingly will cause a HIGH ¾-sample signal to be generated by the receive clock recovery logic 154 only at this state.

The logic interconnections described for the selection inputs to the multiplexing latches of the counter within oscillator 152, above, cause the transition from one state to the next according to their position in Table I, i.e., beginning at reset, the counter changes from W30 to W31, then to W32, etc. However, because the selection inputs to the least-significant latch and to the next-to-least significant latch depend on the $\overline{\text{SHORTEN}}$, CENTER and $\overline{\text{LENGHTEN}}$ signals as described above, the transition from state P0 will depend on whether a lengthen adjustment (return to state P0 once), a center (no adjustment) (change to state P1) or a shorten adjustment (change to state P2) is specified by the $\overline{\text{SHORTEN}}$, CENTER, $\overline{\text{LENGTHEN}}$ signals generated by the recovered-clock to data-clock phase detector 156. This is reflected in Table I by the entry (entries) in the transition column. Since there are a total of sixteen states and each state transition is clocked by the internal clock, resulting in a state transition every 1/16 of the received intra-bit time period, the addition or deletion of one transition as called for at the P0 state causes a lengthening or shortening, respectively, of the clock cycle generated by recovered clock oscillator 152 by 1/16 of the intra-bit time period.

We claim:

1. A method of recovering the clock from Manchester-encoded signals on a pair of signal lines said Manchester-encoded signals being a serial Manchester-encoded stream having an inter-bit period T, comprising the steps of:
   a. generating a recovered-clock signal having a period of approximately T;
   b. detecting "zero-crossing" when the signed voltage differential on said pair of signal lines becomes zero;
   c. comparing the occurrence of the "zero-crossing" of the received signals with the occurrence of the "mid-point" T/2 of the period of the most-recently-generated recovered-clock signal;
   d. generating a recovered-clock signal having a period shorter than, equal to, or greater than the period of the most-recently-generated recovered-clock signal depending on whether the comparison step (c) indicated the occurrence of said "zero-crossing" to be before, coincident with, or after, respectively, said "mid-point" T/2 occurrence of said most-recently-generated recovered-clock signal; and
   e. repeating steps (b), (c) and (d) on the next-received serial signal.

2. The clock-recovery method of claim 1 wherein said recovered-clock generation steps (a) and (d) further call for sequencing an n-state counter, each state transition occuring at a T/n interval, step (a) further calling for resetting said n-state counter, and step (d) further calling for a one-state-skipping transition, a next-state transition, or a same-state transition of said n-state clock-recovery counter depending on whether said "zero-crossing" occurred before, coincident with, or after, respectively, said "mid-point".

3. The clock-recovery method of claim 2 wherein $n=16$ and said comparison step (c) further calls for generating $\overline{\text{SHORTEN}}$, CENTER, $\overline{\text{LENGTHEN}}$ signals according to the equations:

$$\overline{\text{SHORTEN}} = f(\text{state})$$

$$\text{CENTER} = g(\text{state})$$

$$\overline{\text{LENGHTEN}} = h(\text{state})$$

wherein f, g and h are Boolean functions of said n-state counter, and said recovered-clock generation step (d) further calls for generating a recovered-clock signal having a period shorter-than, equal to, or greater-than said period of said most-recently-generated recovered-clock signal depending on whether $\overline{\text{LENGTHEN}}$.CENTER, CENTER, or $\overline{\text{SHORTEN}}$.CENTER is a HIGH signal, respectively.

* * * * *